(12) United States Patent
Nakajima

(10) Patent No.: US 10,670,639 B2
(45) Date of Patent: Jun. 2, 2020

(54) APPARATUS FOR DETECTING ALTERNATING CURRENT ZERO CROSS AND VOLTAGE

(71) Applicant: CANON KABUSHIKI KAISHA, Tokyo (JP)

(72) Inventor: Nozomu Nakajima, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/896,100

(22) Filed: Feb. 14, 2018

(65) Prior Publication Data

US 2018/0238937 A1 Aug. 23, 2018

(30) Foreign Application Priority Data

Feb. 21, 2017 (JP) .................. 2017-030245
Dec. 11, 2017 (JP) .................. 2017-237094

(51) Int. Cl.
| | | |
|---|---|---|
| G01R 19/175 | (2006.01) | |
| G03G 15/20 | (2006.01) | |
| G03G 15/00 | (2006.01) | |
| G01R 19/165 | (2006.01) | |

(52) U.S. Cl.
CPC ..... *G01R 19/175* (2013.01); *G01R 19/16566* (2013.01); *G03G 15/2003* (2013.01); *G03G 15/2039* (2013.01); *G03G 15/5037* (2013.01); *G03G 15/80* (2013.01)

(58) Field of Classification Search
CPC .... H03K 5/153; H03K 5/1534; H03K 5/1536; G03G 15/20
See application file for complete search history.

(56) References Cited

U.S. PATENT DOCUMENTS

| | | | |
|---|---|---|---|
| 2008/0309379 A1* | 12/2008 | Carroll | H03K 5/1536 327/79 |
| 2013/0307586 A1* | 11/2013 | O'Connell | H03K 5/1536 327/79 |
| 2014/0198337 A1 | 7/2014 | Nakajima et al. | |
| 2014/0254210 A1 | 9/2014 | Hayasaki et al. | |
| 2015/0003854 A1* | 1/2015 | Shibasaki | G03G 15/80 399/67 |
| 2015/0380927 A1 | 12/2015 | Nakajima et al. | |

FOREIGN PATENT DOCUMENTS

| | | |
|---|---|---|
| JP | 2003-098860 A | 4/2003 |
| JP | 2006-216657 A | 8/2006 |

* cited by examiner

*Primary Examiner* — Nguyen Tran
(74) *Attorney, Agent, or Firm* — Venable LLP

(57) ABSTRACT

A detection apparatus has an alternating-current voltage input unit and a generation circuit. The generation circuit generates a superimposition signal in which information indicating a timing of a zero cross in an alternating-current voltage inputted into the input unit and information indicating a voltage level of the alternating-current voltage are superimposed.

15 Claims, 23 Drawing Sheets

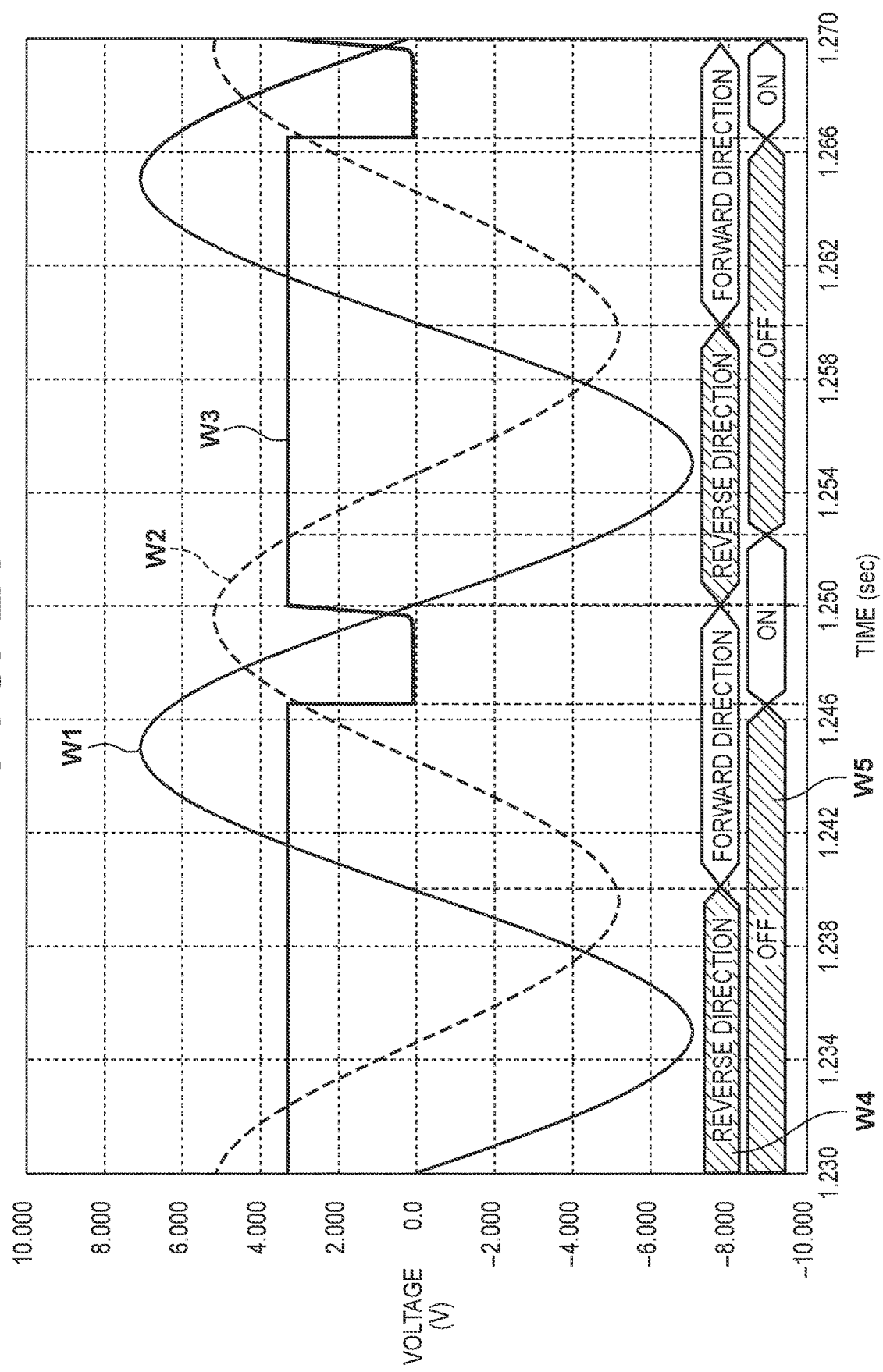

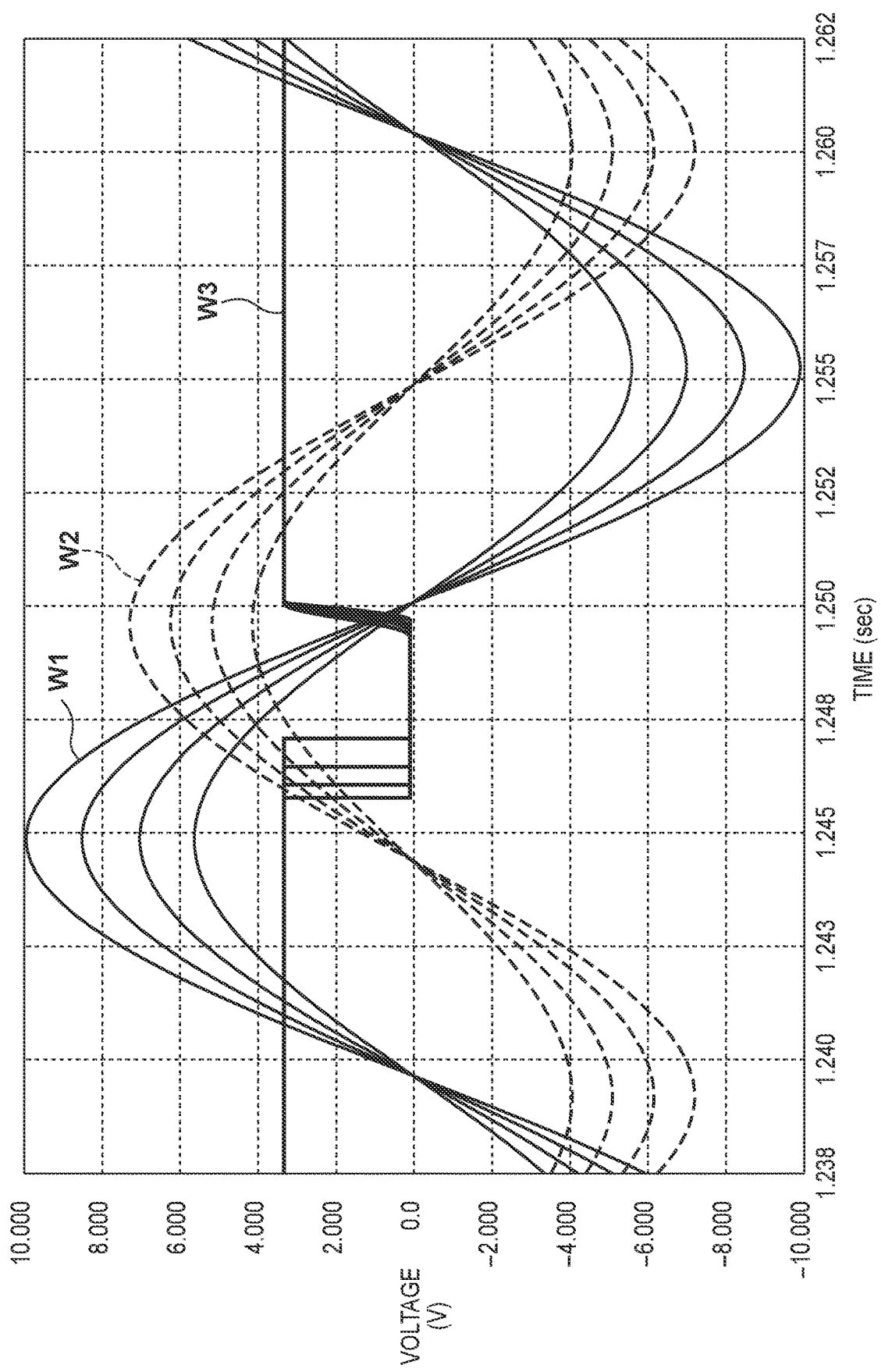

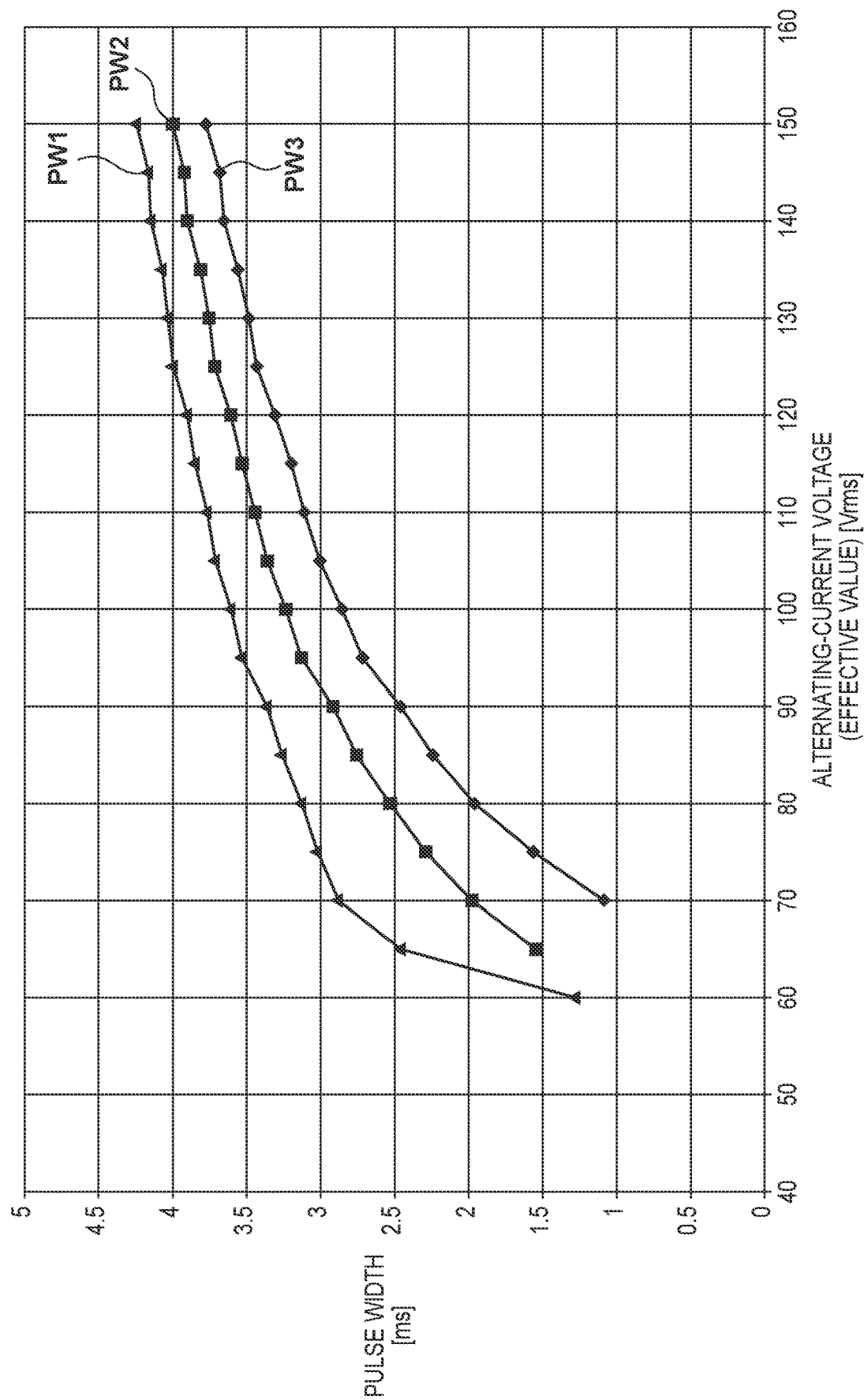

FIG. 4

| PULSE WIDTH t [ms] | ALTERNATING-CURRENT VOLTAGE [Vrms] |
|---|---|
| t < 2.45 | LESS THAN 80V |
| 2.45 ≤ t < 2.66 | 80V |
| 2.66 ≤ t < 2.85 | 85V |
| 2.85 ≤ t < 3.04 | 90V |
| 3.04 ≤ t < 3.19 | 95V |
| 3.19 ≤ t < 3.31 | 100V |
| 3.31 ≤ t < 3.41 | 105V |
| 3.41 ≤ t < 3.50 | 110V |
| 3.50 ≤ t < 3.58 | 115V |
| 3.58 ≤ t < 3.68 | 120V |
| 3.68 ≤ t < 3.75 | 125V |
| 3.75 ≤ t < 3.80 | 130V |
| 3.80 ≤ t < 3.87 | 135V |
| 3.87 ≤ t < 3.93 | 140V |
| 3.93 ≤ t < 3.98 | 145V |
| 3.98 ≤ t < 4.02 | 150V |
| 4.02 ≤ t | EXCEEDING 150V |

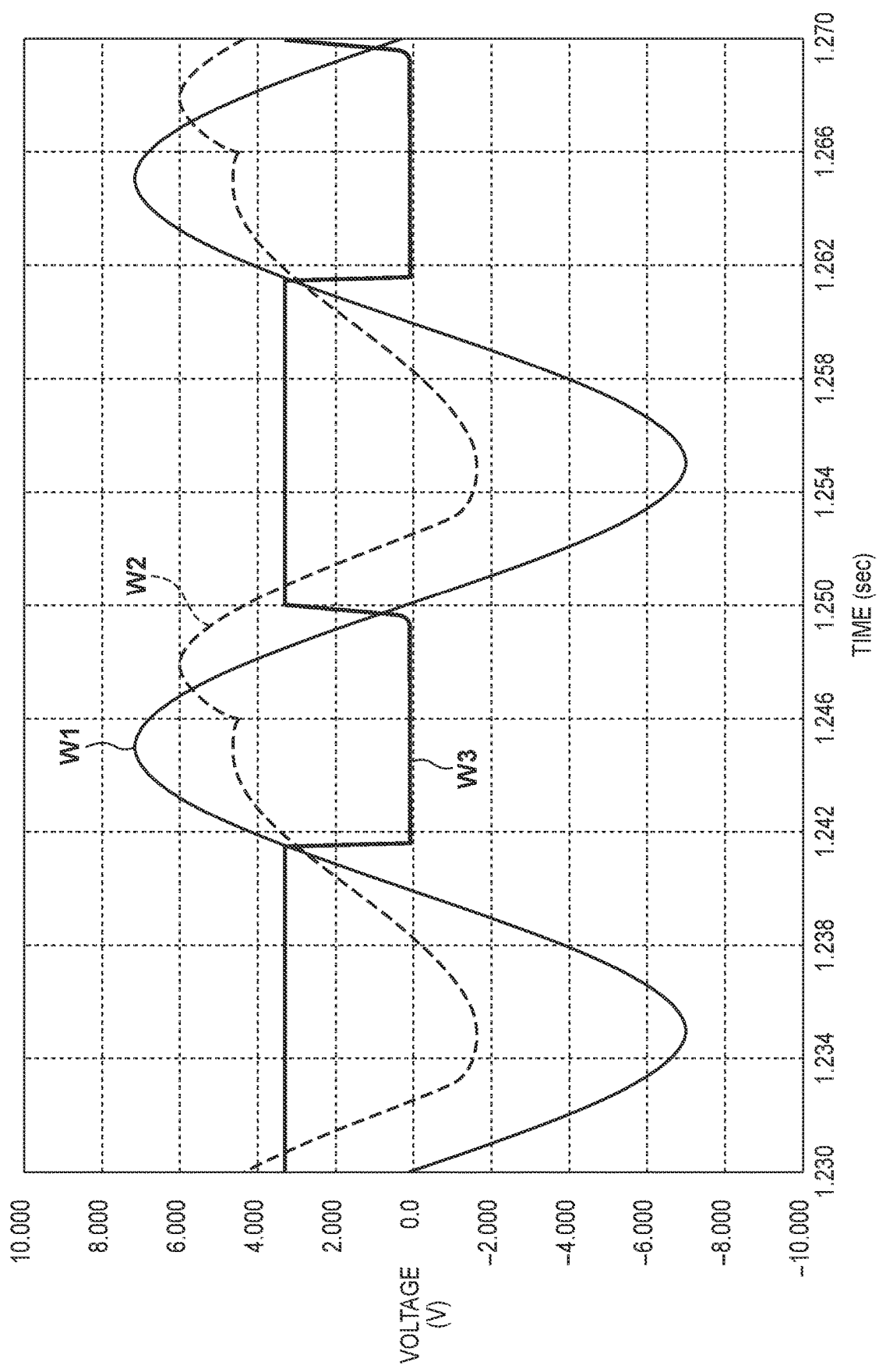

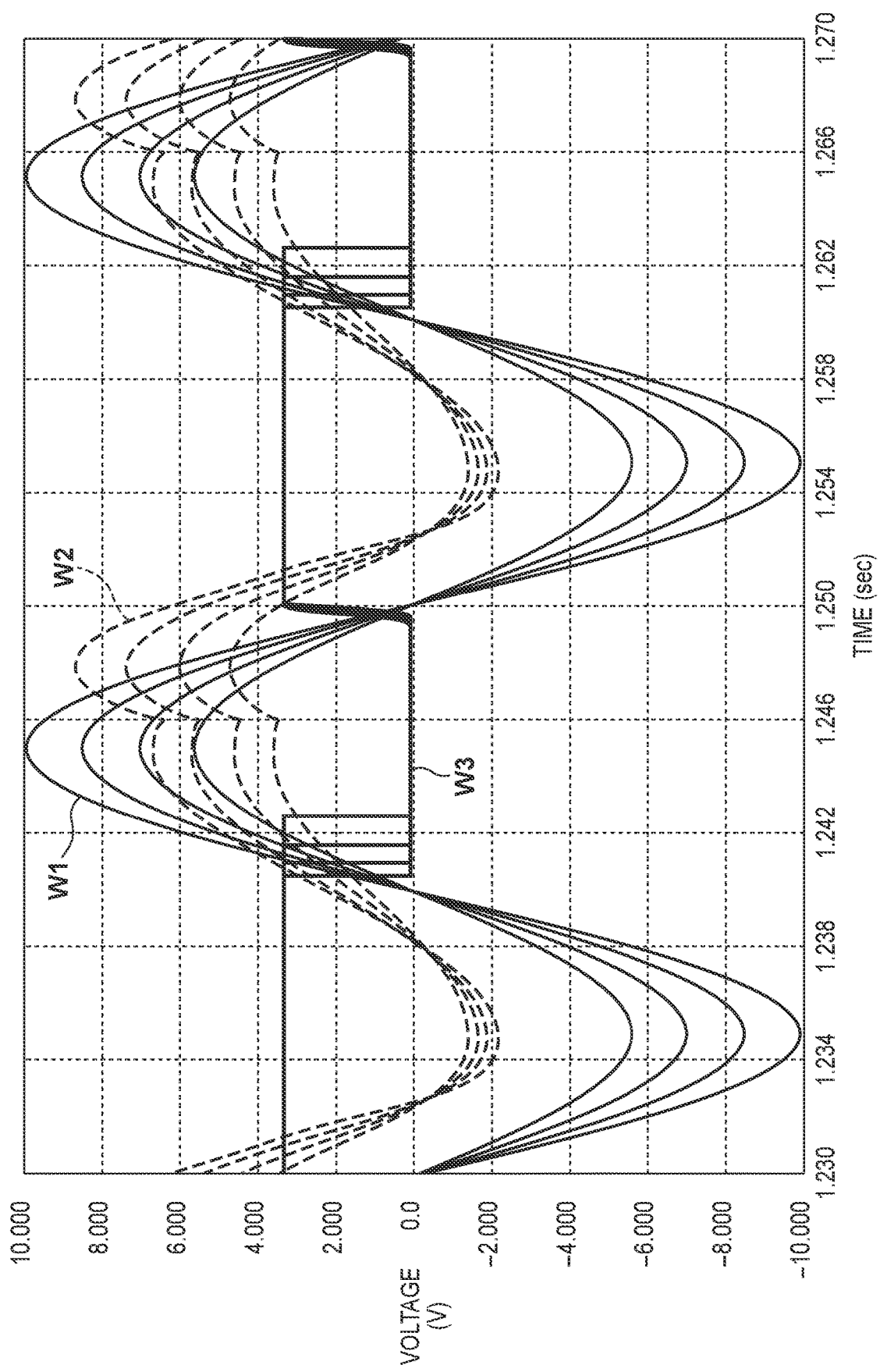

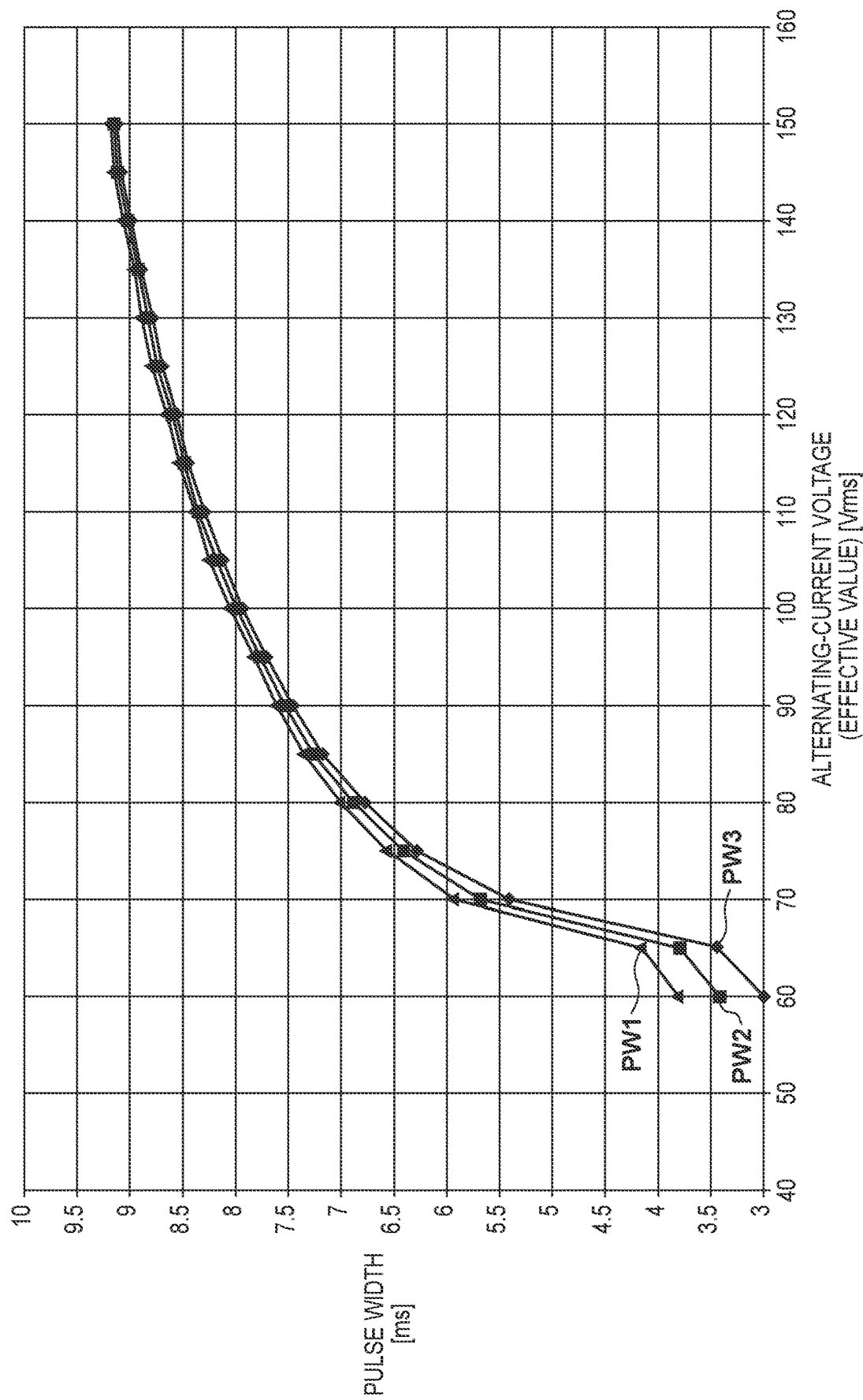

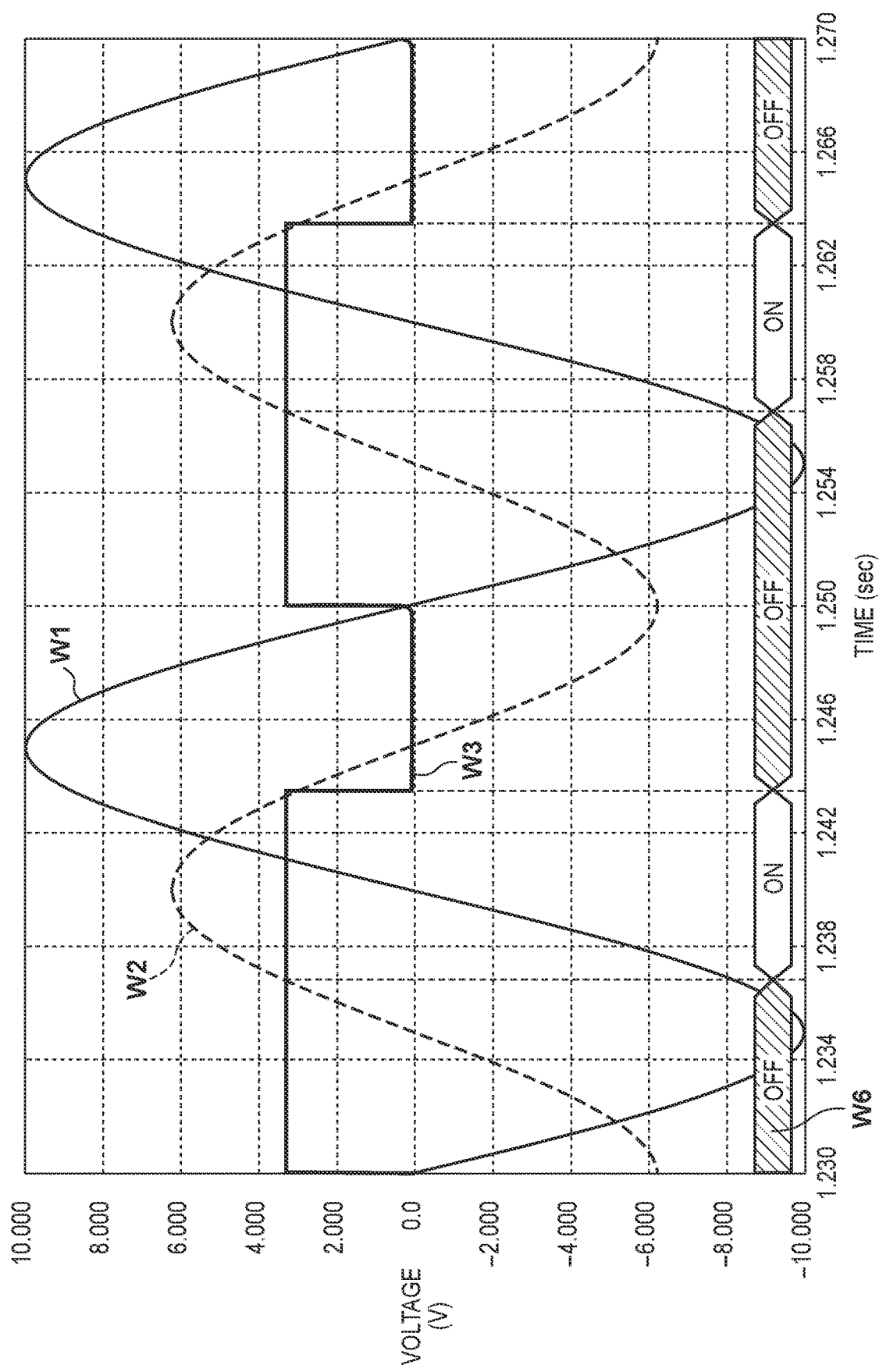

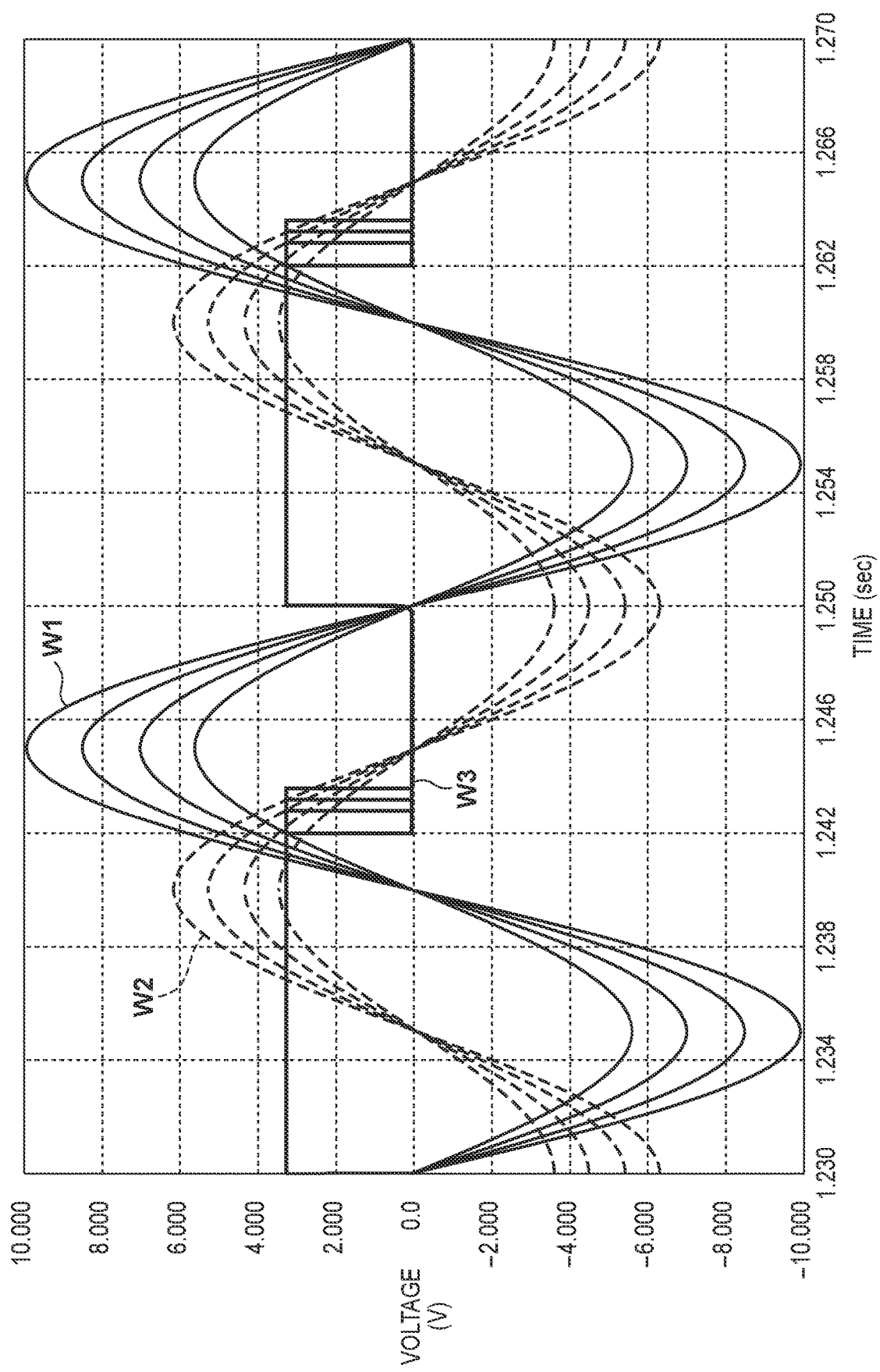

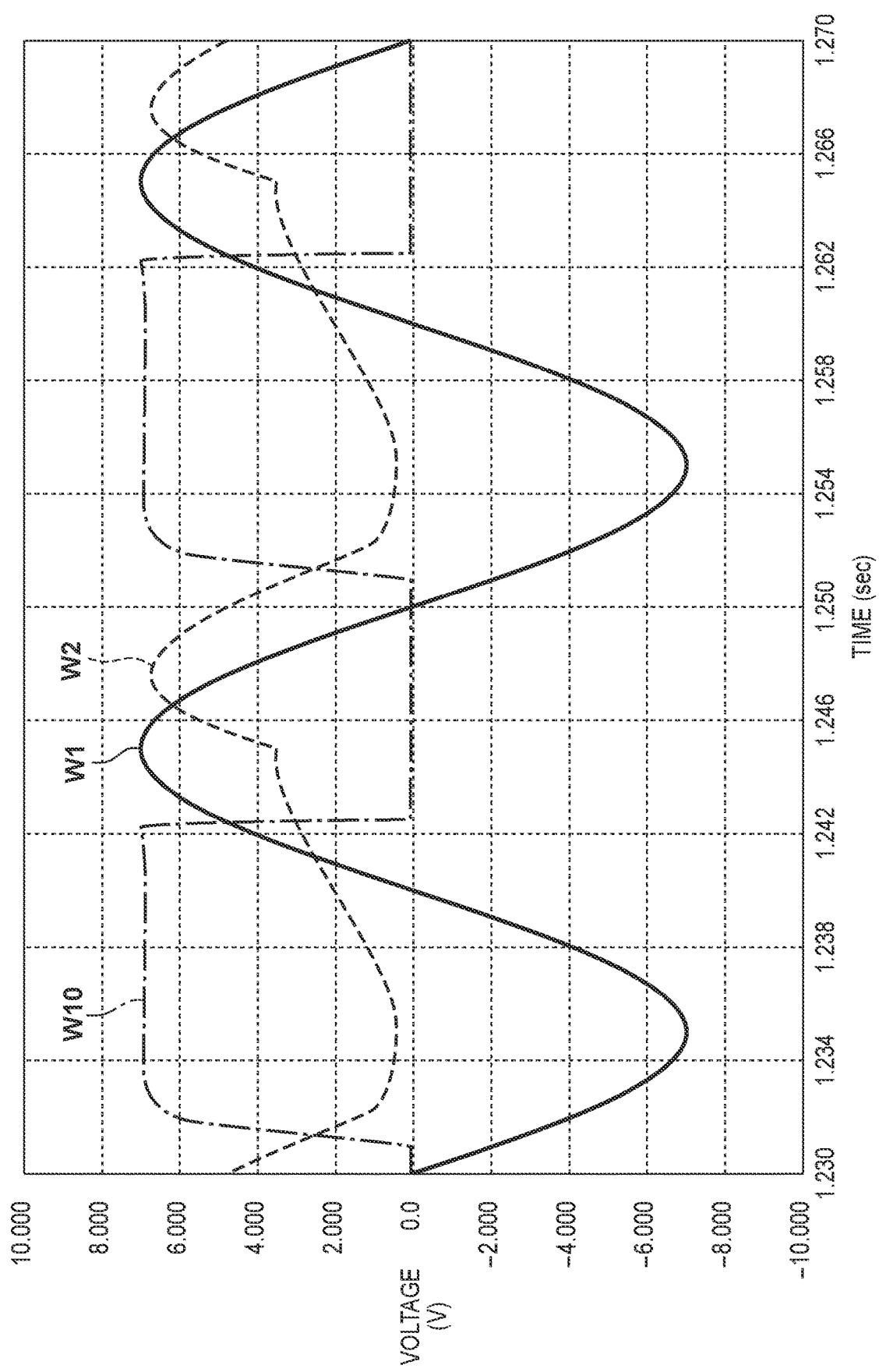

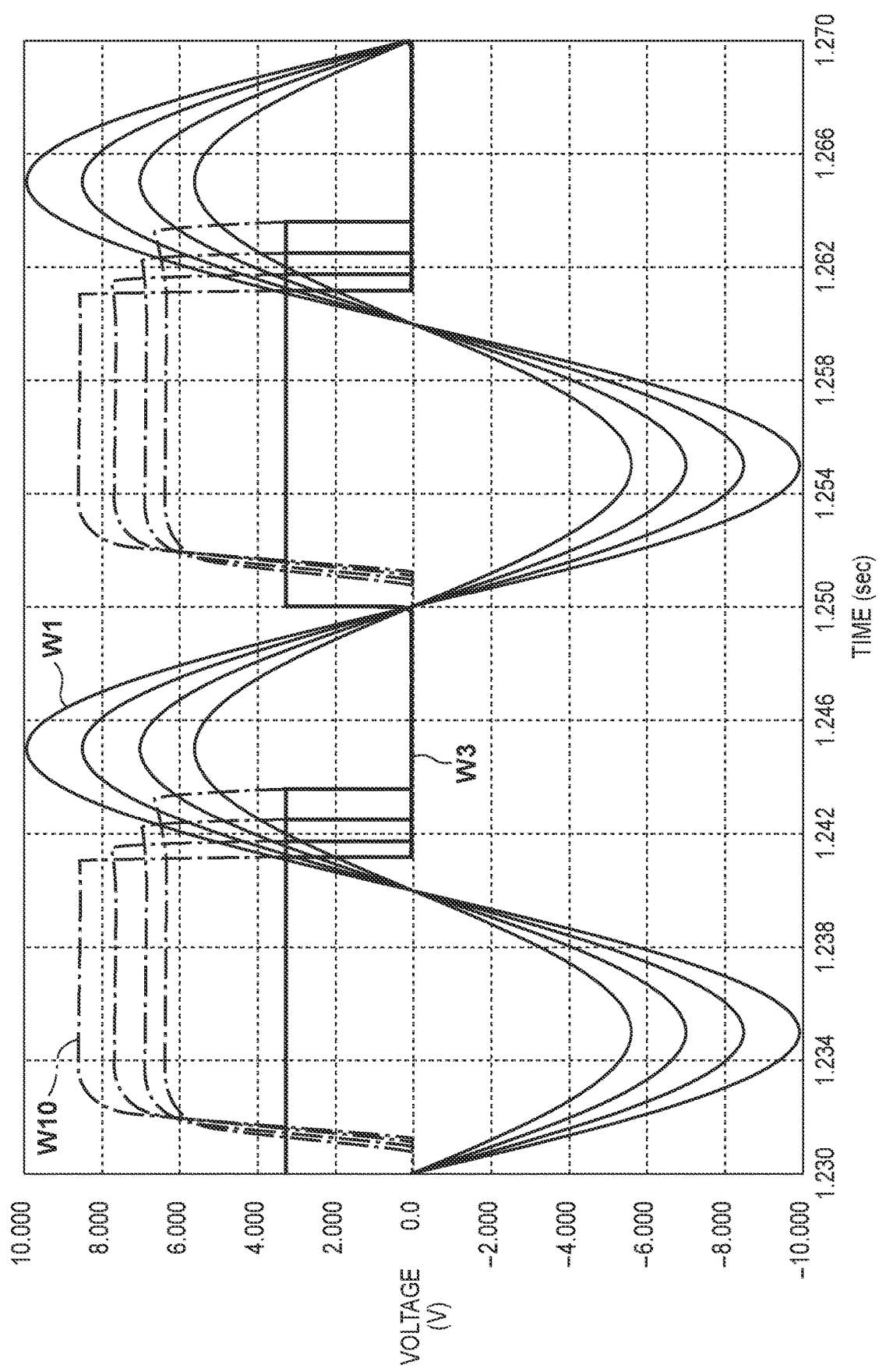

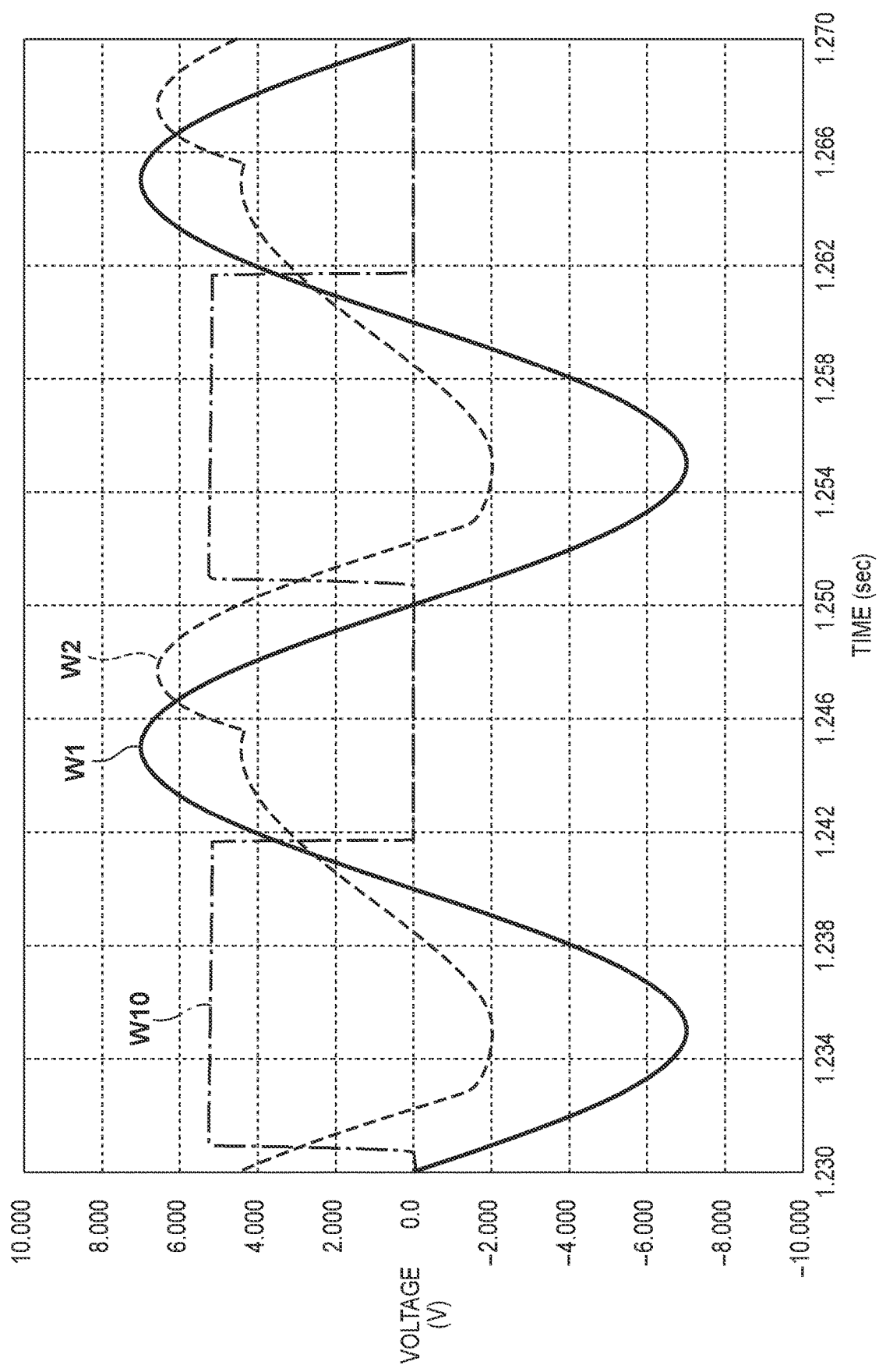

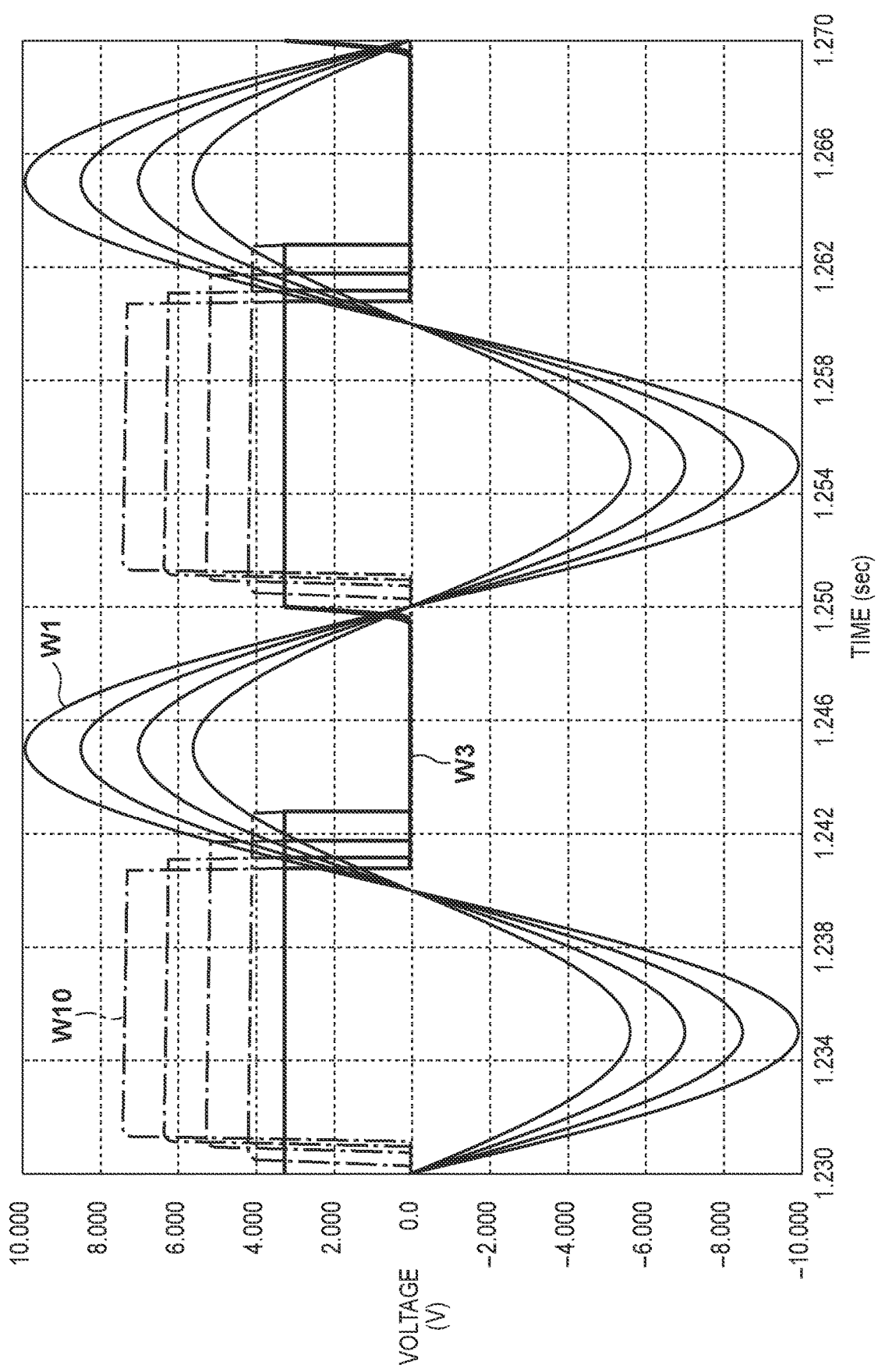

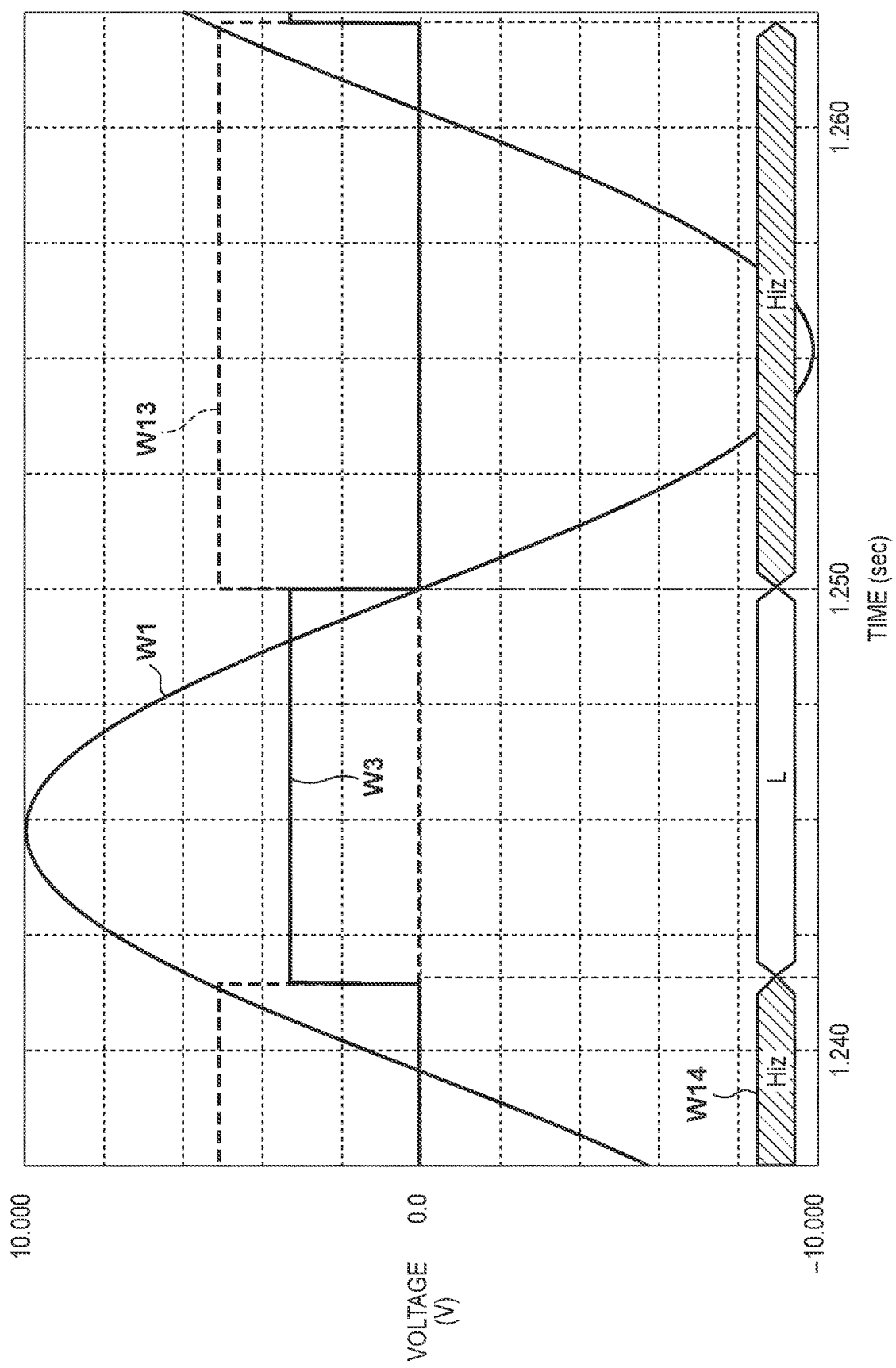

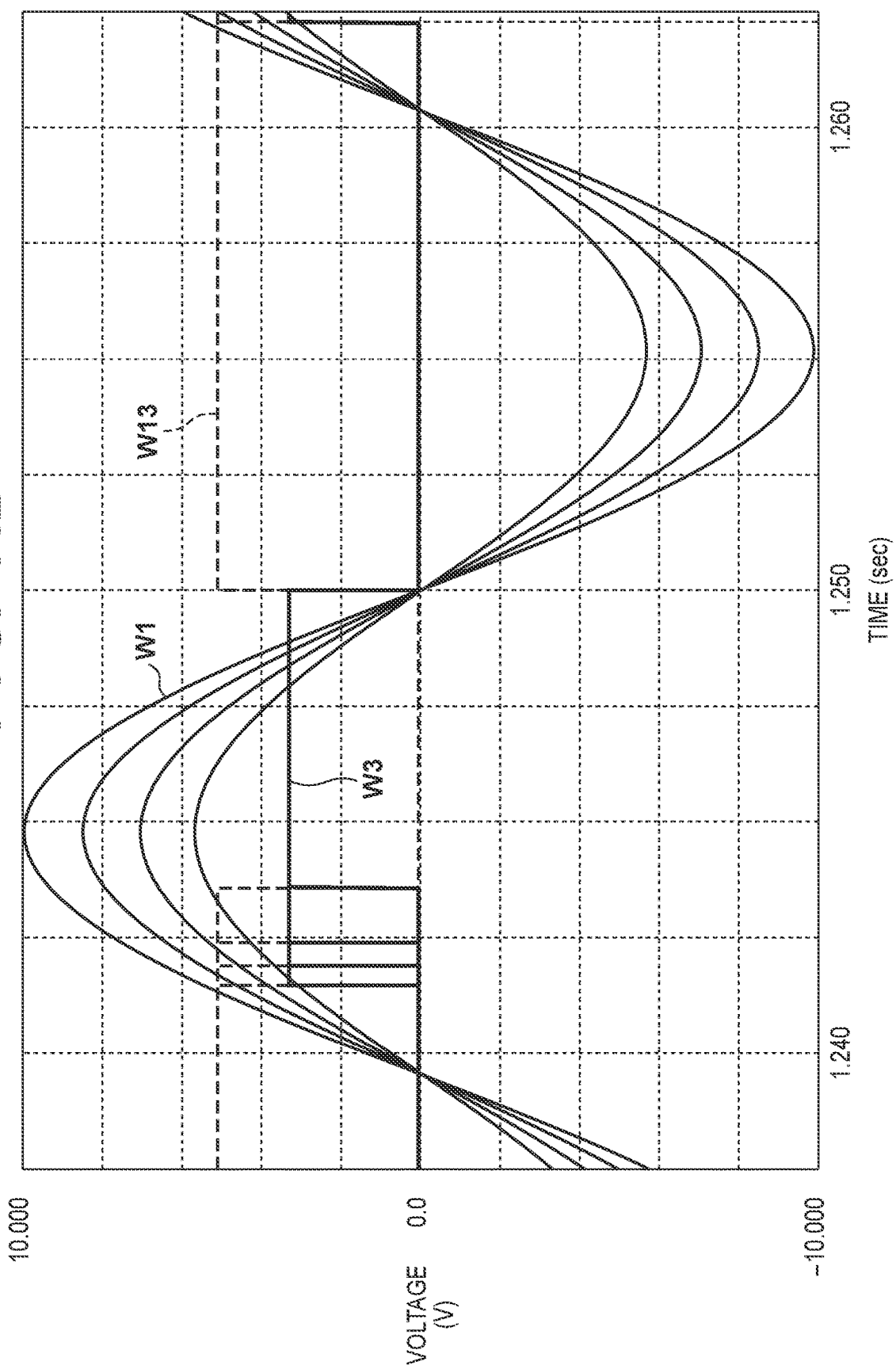

APPARATUS FOR DETECTING ALTERNATING CURRENT ZERO CROSS AND VOLTAGE

BACKGROUND OF THE INVENTION

Field of the Invention

The present invention relates to an apparatus for detecting alternating current zero cross and voltage.

Description of the Related Art

Typically, an image forming apparatus uses a commercial alternating current power supply as a power supply source. There are cases in which an image forming apparatus controls power supplied to a load using an alternating current zero cross as a reference. A detection circuit for detecting such a zero cross is proposed in Japanese Patent Laid-Open No. 2006-216657.

However, there are countries in which there is much variation in alternating-current voltage supplied from a commercial alternating current power supply. In order to protect a power supply apparatus and a load from such variation, a load may be controlled appropriately in accordance with the alternating-current voltage detected by the detection circuit. An alternating-current voltage detection circuit is proposed by Japanese Patent Laid-Open No. 2003-098860.

A control apparatus such as a microcomputer may control an image forming apparatus by obtaining a zero cross signal that a zero cross detection circuit outputs and a voltage signal that an alternating-current voltage detection circuit outputs. However, since the two detection circuits are independent, the control apparatus requires many circuit components such as two signal lines and two input ports.

SUMMARY OF THE INVENTION

The present invention reduces the number of signal lines for transferring a zero cross and an alternating-current voltage.

The present invention provides a detection apparatus comprising: an alternating-current voltage input unit; and a generation circuit configured to generate a superimposition signal in which information indicating a timing of a zero cross in an alternating-current voltage inputted into the input unit and information indicating a voltage level of the alternating-current voltage are superimposed.

Further features of the present invention will become apparent from the following description of exemplary embodiments (with reference to the attached drawings).

BRIEF DESCRIPTION OF THE DRAWINGS

FIG. 2A is a view for describing a pulse signal generation principle.

FIG. 2B is a view for describing a relationship between an input alternating-current voltage and a pulse signal.

FIG. 2C is a view for describing a relationship between an input alternating-current voltage and a pulse width.

FIG. 4 is a view that illustrates a voltage table.

FIG. 6A is a view for describing a pulse signal generation principle.

FIG. 6B is a view for describing a relationship between an input alternating-current voltage and a pulse width.

FIG. 6C is a view for describing a relationship between an input alternating-current voltage and a pulse width.

FIG. 8A is a view for describing a pulse signal generation principle.

FIG. 8B is a view for describing a relationship between an input alternating-current voltage and a pulse width.

FIG. 10A is a view for describing a pulse signal generation principle.

FIG. 10B is a view for describing a relationship between an input alternating-current voltage and a pulse width.

FIG. 12A is a view for describing a pulse signal generation principle.

FIG. 12B is a view for describing a relationship between an input alternating-current voltage and a pulse width.

FIG. 14A is a view for describing a pulse signal generation principle.

FIG. 14B is a view for describing a relationship between an input alternating-current voltage and a pulse width.

DESCRIPTION OF THE EMBODIMENTS

In accordance with the present invention, a detection apparatus that generates a superimposition signal in which information indicating a timing of a zero cross in an alternating-current voltage and information indicating a voltage level of the alternating-current voltage are superimposed is provided. The number of signal lines is reduced thereby. More specifically, a detection apparatus that generates a pulse signal including a first edge that indicates a timing of a zero cross in an alternating-current voltage and a second edge for which a time interval in relation to the first edge changes in accordance with the voltage level of the alternating-current voltage is provided.

First Embodiment

In a first embodiment, a first edge that indicates the timing of the zero cross is generated by the forward voltage being applied to a diode dropping to less than or equal to a threshold. When a voltage that is correlated with an alternating-current voltage applied to a gate of a FET connected in series with a diode exceeds the threshold, the FET conducts electricity, thereby causing the diode to conduct electricity, and a second edge indicating the voltage level of the alternating-current voltage is generated. This uses the property that the timing at which the voltage level exceeds the threshold will be earlier if the voltage level of the alternating-current voltage is higher, and at which the timing of the voltage level exceeds the threshold will be later if the voltage level is lower. FET is an abbreviation for field-effect transistor. A microcomputer recognizes a temporal position of the first edge as a zero cross point of the alternating-current voltage. Also, the microcomputer recognizes the time interval from the second edge until the first edge as the voltage level of the alternating-current voltage.

Figure 1:
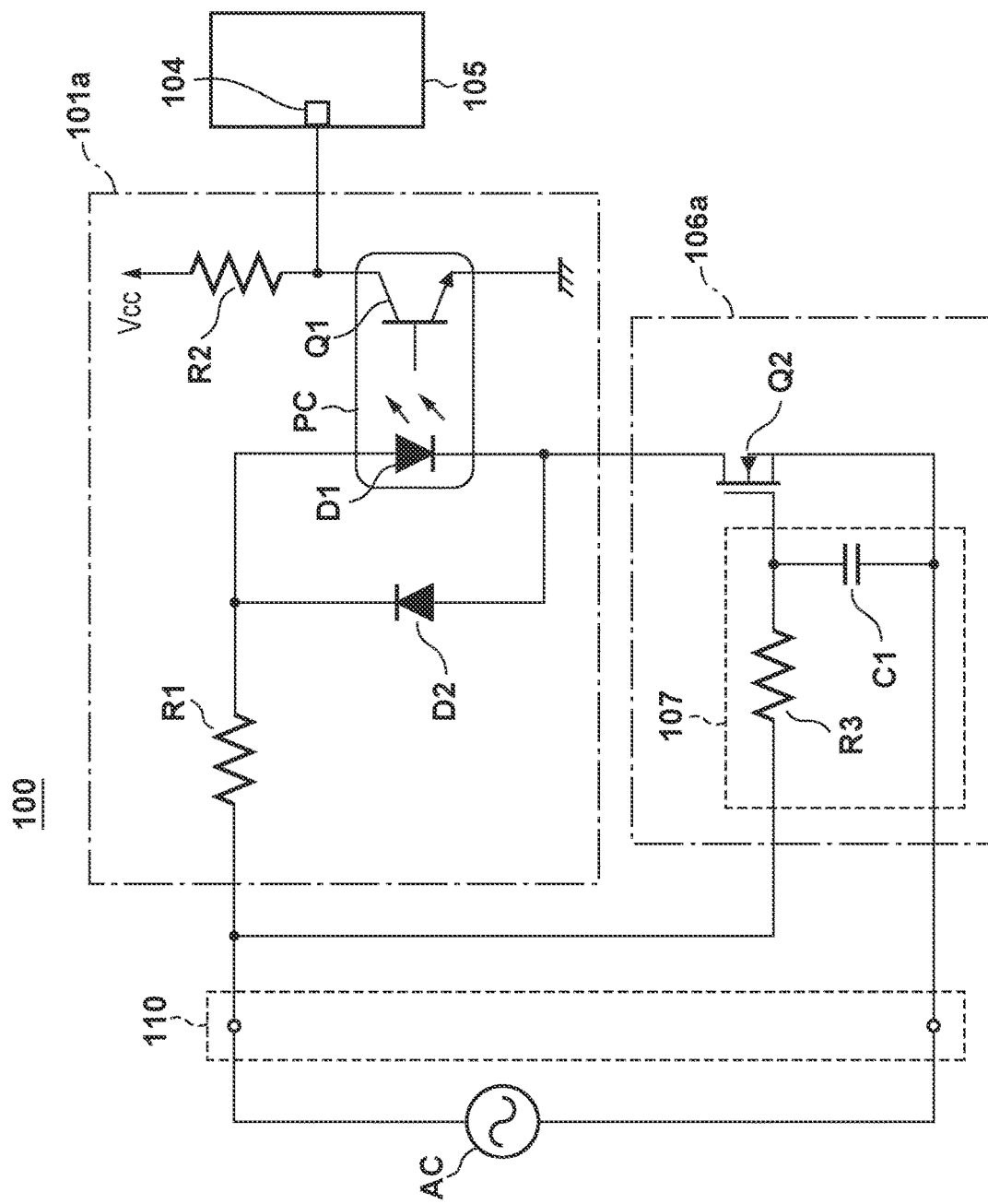
FIG. 1 is a view illustrating a detection apparatus in a first embodiment.

FIG. 1 is a circuit diagram of a detection apparatus 100 for detecting a voltage level and zero cross of an alternating-current voltage in the first embodiment. A zero cross detection unit 101a is a circuit for detecting a timing of a zero cross of the alternating-current voltage supplied from the commercial alternating current power supply AC. Note that the alternating-current voltage supplied from the commercial alternating current power supply AC is inputted into an input unit 110 such as an input terminal. A voltage detection unit 106a is a circuit for detecting a voltage level (effective value) of the alternating-current voltage supplied from the commercial alternating current power supply AC.

A photocoupler PC has a light emitting diode D1 and a phototransistor Q1, and is an insulation element for insulating a primary side and a secondary side of the photocoupler PC. In FIG. 1, the commercial alternating current power supply AC is connected to a primary side. A microcomputer 105 is connected to a secondary side. The light emitting diode D1 is turned on or turned off in accordance with information on the primary side. The phototransistor Q1 receives light from the light emitting diode D1, and outputs a signal according to the received light. A diode D2 is formed in parallel with the light emitting diode D1. The diode D2 conducts electricity in a case where the alternating-current voltage supplied from the commercial alternating current power supply AC is a negative voltage and does not conduct electricity in a case where it is positive. The end-to-end voltage of the light emitting diode D1 of the photocoupler PC is thereby suppressed to a tolerable voltage of the light emitting diode D1 or less. A resistor R1 is a current-limiting resistor that protects the light emitting diode D1 by restricting the current that would flow to the light emitting diode D1.

The voltage detection unit 106a is connected in series to the light emitting diode D1. The voltage detection unit 106a has a level detection unit 107 for detecting the voltage level of the alternating-current voltage supplied from the commercial alternating current power supply AC and a FET Q2 for conducting electricity or not conducting electricity in accordance with the voltage level. The level detection unit 107 has a resistor R3 and a capacitor C1 which configure a low-pass filter (LPF), and imparts a phase delay to a voltage correlated to the alternating-current voltage and applies the voltage to the FET Q2. When the gate voltage of the FET Q2 exceeds the gate threshold of the FET Q2, electricity is conducted between the drain and the source of the FET Q2. When the FET Q2 conducts electricity at the time that the voltage applied to the light emitting diode D1 exceeds the forward voltage VF, a forward current flows to the light emitting diode D1. A collector of the phototransistor Q1 is pulled up to the power source voltage Vcc (example: 3.3V) by a resistor R2. Accordingly, the phototransistor Q1 generates a pulse signal having a binary voltage level of H (approximately 3.3V) or L (approximately 0V), and inputs the pulse signal into an input port 104 of the microcomputer 105. H is an abbreviation for high level. L is an abbreviation for low level. Note that when the light emitting diode D1 turns on, the phototransistor Q1 conducts electricity, and the pulse signal is L. When the light emitting diode D1 is turned off, the phototransistor Q1 does not conduct electricity, and the pulse signal is H.

FIG. 2A illustrates a voltage waveform W1 of the commercial alternating current power supply AC, a voltage waveform W2 of the gate terminal of the FET Q2, and a voltage waveform W3 of the pulse signal. The abscissa indicates time. The ordinate indicates voltage. The voltage of the commercial alternating current power supply AC is assumed to be 100 Vrms. The voltages of the other waveforms are voltages in the range of several V. Here, in order to represent all waveforms within the same graph, for convenience, the voltage of the commercial alternating current power supply AC is shown graphically at 1/20 of its actual magnitude. An operation state W4 of the light emitting diode D1 of the photocoupler PC and an operation state W5 of the FET Q2 are illustrated by overlapping these voltage waveforms. The reverse direction indicates that voltage in the reverse direction is being applied to the light emitting diode D1. Forward direction indicates that voltage in the forward direction is being applied to the light emitting diode D1. ON indicates a conductive state. OFF indicates a non-conductive state.

The light emitting diode D1 enters a conductive state when the voltage of the commercial alternating current power supply AC exceeds a predetermined value (approximately 1.0V which is the forward voltage VF of the light emitting diode of the photocoupler PC). In this way, the forward voltage VF is much smaller as compared to the 100 Vrms which is the effective value of the alternating-current voltage of the commercial alternating current power supply AC. Accordingly, the timing of the switch between when the light emitting diode D1 conducts electricity to when it does not conduct electricity substantially indicates the zero cross timing of the commercial alternating current power supply AC.

In the first embodiment, the light emitting diode D1 is connected in series with the FET Q2. Accordingly, the zero cross timing can only be detected when the FET Q2 is conducting electricity. As illustrated in FIG. 2A, in the state in which the FET Q2 is conducting electricity, and when the zero cross timing of the commercial alternating current power supply AC arrives, the light emitting diode D1 switches from a conductive state to a non-conductive state. A rising edge (the timing at which the level of the pulse signal changes from L to H) of the pulse signal is generated thereby.

Meanwhile, the voltage of the commercial alternating current power supply AC is inputted into the LPF formed by the resistor R3 and the capacitor C1. The cut-off frequency of the LPF is set so that the phase of voltage is delayed by between several tens of degrees to 90 degrees in the range of 50 Hz to 60 Hz which is the frequency of the commercial alternating current power supply AC. By this operation of the LPF, the waveform of the gate voltage of the FET Q2 becomes the voltage waveform W2 as illustrated by the broken line in FIG. 2A. The gate threshold of the FET Q2 may be 3V, for example. In such a case, the FET Q2 transitions into a conductive state at the point in time when the gate voltage exceeds 3V. By the influence of the phase delay due to the LPF, the timing at which the FET Q2 is conducting electricity and the timing at which it is not conducting electricity are delayed in relation to the photocoupler PC. The photocoupler PC and the FET Q2 are connected in series to the commercial alternating current power supply AC. Accordingly, only in a case where both the photocoupler PC and the FET Q2 are conducting electricity is the information transferred to the secondary side. The falling edge of the pulse signal, which is the timing of the onset of information transfer to the secondary side, is generated by the FET Q2 conducting electricity. The rising edge, which is the timing at which information transfer to the secondary side ends, is generated by the light emitting diode D1 switching from conducting electricity to not conducting electricity.

FIG. 2B illustrates voltage waveforms W1 through W3 where the voltage of the commercial alternating current power supply AC is changed in four 20V increments in the range from 80V to 140V. The temporal position of the rising edge generated by the light emitting diode D1 ceasing to conduct electricity does not change much even though the voltage of the commercial alternating current power supply AC is changed. The forward voltage VF of the light emitting diode D1 is sufficiently small in relation to the voltage of the commercial alternating current power supply AC. Accordingly, the position of the rising edge is not affected much by the difference in gradient (dv/dt) due to the change in the voltage of the commercial alternating current power supply AC.

Meanwhile, the falling edge generated when the FET Q2 conducts electricity changes greatly in accordance with the change in voltage of the commercial alternating current power supply AC. This is because the gate threshold of the FET Q2 (3V) and the gate voltage of the FET Q2 (approximately between 4 Vpeak and 5 Vpeak) are close to each other. Accordingly, the position of the falling edge is influenced by the difference in gradient (dv/dt) of the gate voltage of the FET Q2 due to the change in voltage of the commercial alternating current power supply AC. As FIG. 2B illustrates, the time over which the gate voltage of the FET Q2 exceeds the gate threshold of the FET Q2 differs greatly depending on the voltage of the commercial alternating current power supply AC. Accordingly, the falling edge generation timing changes greatly depending on the voltage of the commercial alternating current power supply AC. The timing at which the FET Q2 ceases to conduct electricity also changes greatly depending on the voltage of the commercial alternating current power supply AC similarly to the case of conducting electricity. However, the LPF is designed so that at the timing at which the FET Q2 ceases to conduct electricity, the light emitting diode D1 is invariably not conducting electricity. Thereby, the pulse signal does not depend on the timing at which the FET Q2 ceases to conduct electricity.

FIG. 2C illustrates a relationship between the pulse width and the voltage of the pulse signal. The pulse width means the time from when the falling edge is detected to when the rising edge is detected. The abscissa indicates the effective value of the alternating-current voltage supplied from the commercial alternating current power supply AC. The ordinate indicates the pulse width of the pulse signal. PW2 indicates the pulse width in a typical case where there is no variation in the circuit component. PW1 indicates properties in a case where the pulse width reaches a maximum due to variation in the circuit component. PW3 indicates properties in a case where the pulse width reaches a minimum due to variation in the circuit component. The variation of the resistor R3 is ±1%. The variation of the capacitor C1 is ±10%. The variation of the gate threshold of the FET Q2 is ±3%. In the first embodiment, the variation of the capacitor C1 brings about a large effect on the pulse width. Accordingly, by employing a variable resistor as the resistor R3 and setting the resistance value appropriately in relation to the variation of the capacitor C1, the voltage of the commercial alternating current power supply AC will be detected at an even higher precision.

Figure 3:
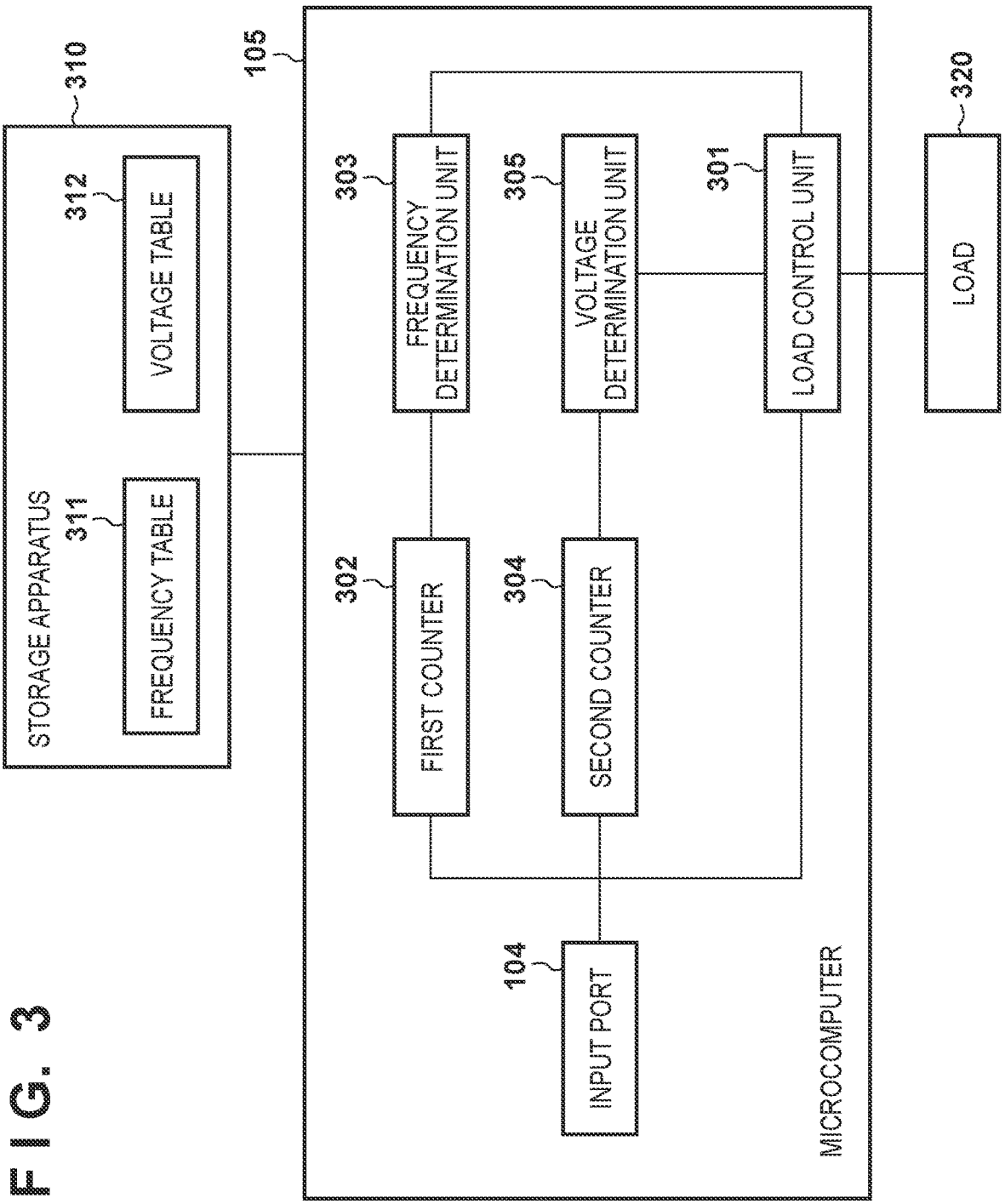
FIG. 3 is a view for describing a function of a microcomputer.

FIG. 3 illustrates functions of the microcomputer 105. The microcomputer 105 may be realized by a CPU, may be realized by an ASIC, an FPGA, or the like, and may be realized by a combination thereof. ASIC is an abbreviation for application specific integrated circuit. FPGA is an abbreviation for field-programmable gate array. A control program may be stored in a storage apparatus 310. Here, it is assumed that the following function are realized by a CPU executing a control program.

A load control unit 301 is able to recognize a zero cross timing of the alternating-current voltage of the commercial alternating current power supply AC by detecting the rising edge of the pulse signal inputted into the input port 104. A first counter 302 measures the time between adjacent rising edges in the pulse signal. This time corresponds to one period. The reciprocal of one period is the frequency. Note that the time between adjacent falling edges may also be measured. A frequency determination unit 303 converts the count value of the first counter 302 into a frequency by referencing a frequency table 311 stored in the storage apparatus 310. Note that a function may be used in place of the frequency table 311. A second counter 304 measures the time (pulse width) from the falling edge until the rising edge of the pulse signal. A voltage determination unit 305 converts the count value of the second counter 304 into a voltage value by referencing a voltage table 312 stored in the storage apparatus 310. Note that a function (approximation expression) may be used in place of the voltage table 312.

FIG. 4 illustrates the voltage table 312 for converting the pulse width measured by the second counter 304 into a voltage value. Here, 50 Hz is envisioned as the frequency of the alternating-current voltage, but there are regions in which a 60 Hz frequency is used. Accordingly, the storage apparatus 310 may have voltage tables 312 for each frequency. In such a case, the voltage determination unit 305 may select the voltage table 312 based on the frequency which is determined by the frequency determination unit 303. Alternatively, the storage apparatus 310 may store a single normalized voltage table 312 and a correction coefficient for each frequency. The voltage determination unit 305 may select the correction coefficient based on the frequency determined by the frequency determination unit 303 and correct the voltage value obtained from a count value and the voltage table 312 by the correction coefficient. The voltage table 312 illustrated in FIG. 4 is a table for obtaining voltage values in increments of 5V. However, a higher resolution conversion table may be employed in a case where detection of commercial alternating current power supply AC voltages at a higher resolution is desired. Alternatively, even higher resolution voltage values may be calculated by using a function such as an approximation expression.

In FIG. 3, the load control unit 301, triggered by the voltage value determined by the voltage determination unit 305 and the zero cross timing, controls a load 320. For example, if the load 320 is a fixing device of an image forming apparatus of an electrophotographic type, the load control unit 301 can control the power inputted into the heater of the fixing device by wave number control. Wave number control means adjusting the power applied to a heater in units of waves (a half period of the alternating current). The load control unit 301 can recognize the start position of a half period based on the zero cross timing. Furthermore, since the load control unit 301 can also obtain the voltage level of the alternating-current voltage, it can determine the power to be inputted into the heater from the voltage level, and supply to the load 320 the alternating current of the required wave number using the zero cross timing as a reference. Note that the image forming apparatus is only one example, and the first embodiment can be applied to any electric device comprising a load that operates upon supply of an alternating current.

In this way, in accordance with the first embodiment, an information signal in which information indicating the timing of a zero cross and information indicating a voltage level of an alternating-current voltage are superimposed is generated and transmitted. Accordingly, the number of signal lines and input ports 104 for transferring the information signal can be reduced. In other words, it is possible to detect the zero cross and the alternating-current voltage with a reduced number of circuit components.

In particular, in the first embodiment, the zero cross timing is represented by the temporal position of the rising edge of the pulse signal. Also, the alternating-current voltage of the commercial alternating current power supply AC is represented by the time interval between the rising edge and the falling edge of the pulse signal. Accordingly, the microcomputer 105 is enabled to recognize the zero cross timing and the alternating-current voltage from a pulse signal which is inputted from a single input port 104. Note that the time interval between rising edges and the time interval between falling edges are both fixed. Accordingly, the microcomputer 105 can obtain the frequency of the alternating-current voltage from either time interval.

In the first embodiment, the voltage waveform of the commercial alternating current power supply AC is envisioned to be a sinusoidal wave. The conversion table stored in the storage apparatus 310 is generated assuming a sinusoidal wave. There may be cases in which a voltage in something other than a sinusoidal wave, such as a rectangular wave, is supplied from the commercial alternating current power supply AC. In such a case, it is possible for the microcomputer 105 to detect that a rectangular wave or the like was inputted. The gradient (dv/dt) of the voltage of a rectangular wave is much greater as compared to the gradient of the voltage of a sinusoidal wave. Accordingly, the pulse width of a rectangular wave is much longer than the pulse width of a sinusoidal wave. Accordingly, the microcomputer 105 may decide that the waveform of the alternating-current voltage is not a sinusoidal wave when the pulse width measured by the second counter 304 exceeds a predetermined threshold. The voltage determination unit 305 may be in charge of this decision. When the load control unit 301 receives a determination signal meaning that the waveform of the alternating-current voltage is not a sinusoidal wave from the voltage determination unit 305, the load control unit 301 causes the supply of alternating current to the load 320 to stop. For example, the load control unit 301 stops the supply of alternating current by switching off a switch element such as a TRIAC or the like. With this, it becomes possible to protect the load 320.

Note that it is not necessary that the waveform of the alternating-current voltage be a sinusoidal wave in the first embodiment. If the gradient (dv/dt) of the alternating-current voltage changes in accordance with the effective value, the first embodiment can be applied.

In FIG. 1, the LPF is formed by using the resistor R3 and the capacitor C1. Also, the FET Q2 is employed as a switch element. However, any circuit that can appropriately adjust the phase of the alternating-current voltage may be used. In place of the FET Q2, a semiconductor switch such as a transistor, a relay, or the like can be employed if the switch element can switch between a conductive state and a non-conductive state in accordance with the voltage level of the control signal.

A photocoupler PC in which a primary side and a secondary side are insulated is employed in FIG. 1, but this is not required. In place of the photocoupler PC, a switch element such as a semiconductor switch or a relay may be employed. Alternatively, configuration may be taken such that the photocoupler PC is removed, and the drain terminal of the FET Q2 is connected to the input port 104 directly.

Second Embodiment

The second embodiment improves the detection apparatus 100 of the first embodiment to improve the voltage level detection precision. Specifically, by increasing the change in the pulse width in accordance with the difference of the voltage level, the dynamic range of the voltage level widens. In other words, the amount of change in the position of the second edge in relation to the amount of change of the voltage level of the alternating-current voltage becomes greater.

Figure 5:
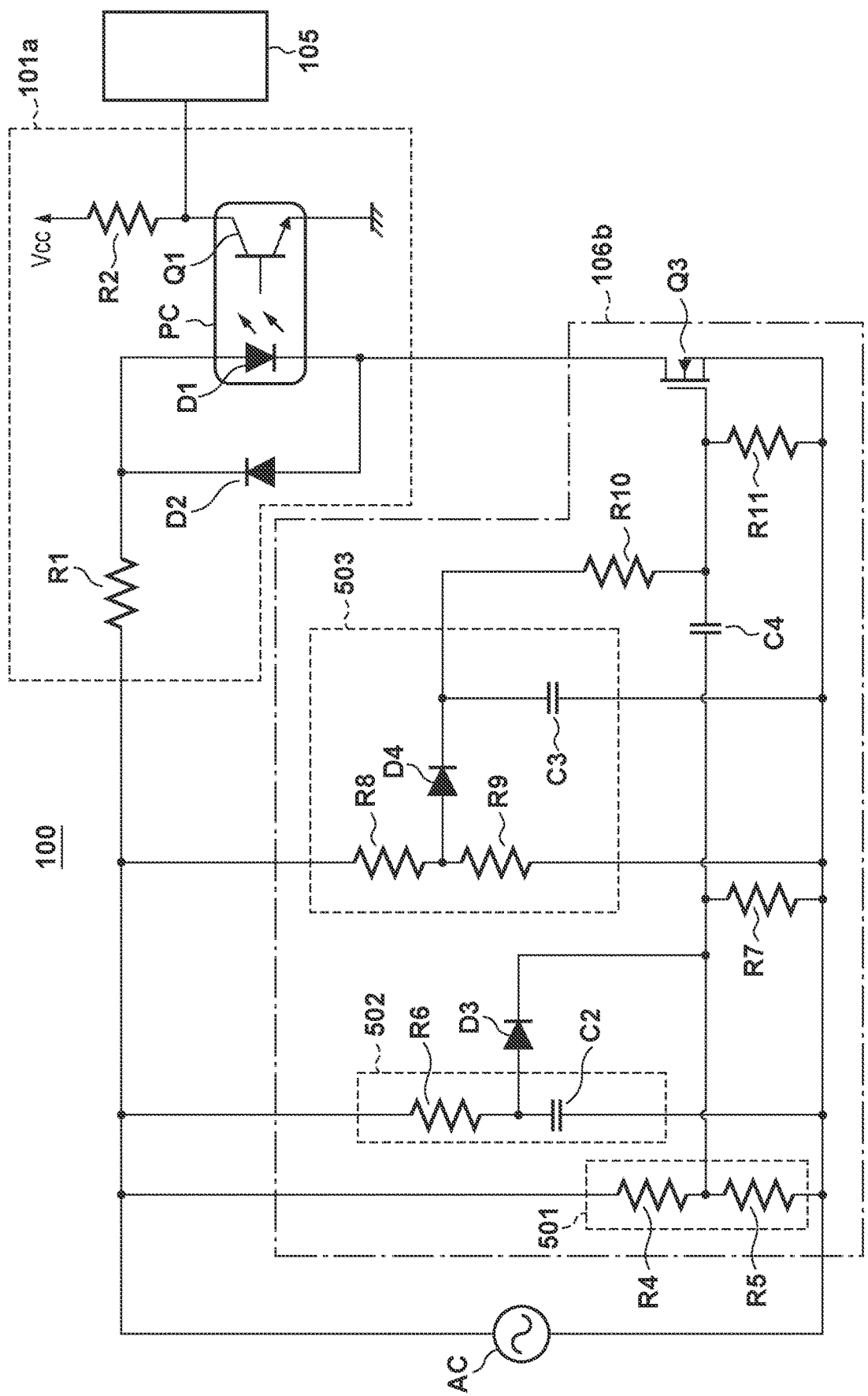
FIG. 5 is a view illustrating a detection apparatus in a second embodiment.

FIG. 5 illustrates the detection apparatus 100 of the second embodiment. In the second embodiment, the same reference numerals are given to circuit elements that are the same as in the first embodiment, and description of the first embodiment is invoked. In the second embodiment, the voltage detection unit 106a is replaced with a voltage detection unit 106b. The voltage detection unit 106b has a level detection unit 501, a timing adjusting unit 502, and a voltage generation unit 503. The alternating-current voltage supplied from the commercial alternating current power supply AC is inputted into the level detection unit 501. The level detection unit 501 is a voltage-dividing circuit formed by a resistor R4 and a resistor R5, and the alternating-current voltage supplied from the commercial alternating current power supply AC is converted into an alternating-current voltage proportional thereto, which is then outputted.

The alternating-current voltage of the commercial alternating current power supply AC is inputted into the timing adjusting unit 502. The timing adjusting unit 502 is a circuit for adjusting the timing at which the FET Q3 switches from on (conducting electricity) to off (not conducting electricity). The timing adjusting unit 502 is an LPF configured by a resistor R6 and a capacitor C2. In other words, the timing adjusting unit 502 delays the phase of the alternating-current voltage and outputs the alternating-current voltage. A diode D3 is arranged with the objective of separating the level detection unit 501 and the timing adjusting unit 502. The current outputted from the level detection unit 501 and the current outputted from the timing adjusting unit 502 both flow into a resistor R7. In other words, the resistor R7 functions as an adder that adds these currents and converts the sum of the currents into a voltage. In this way, the resistor R7 adds the voltage detected by the level detection unit 501 and the voltage outputted from the timing adjusting unit 502.

The voltage generation unit 503 is a circuit for generating a direct-current voltage from the alternating-current voltage supplied from the commercial alternating current power supply AC. A resistor R8 and a resistor R9 of the voltage generation unit 503 form a voltage-dividing circuit which divides the alternating-current voltage and outputs an output voltage (the divided alternating-current voltage). A diode D4 is a rectification element for performing a half wave rectification of the alternating-current voltage generated by the voltage-dividing circuit. A capacitor C3 is a smoothing element for generating a direct current by smoothing the pulsating flow that the diode D4 outputs. The voltage generated by the voltage generation unit 503 is divided by a voltage-dividing circuit which is formed by a resistor R10 and a resistor R11, and the output voltage is applied to the gate of the FET Q3. Similarly, the end-to-end voltage of the resistor R7 is applied to the gate of the FET Q3 via the capacitor C4. In other words, the end-to-end voltage of the resistor R7 and the direct-current voltage from the voltage generation unit 503 are superimposed and the resulting voltage is applied to the gate of the FET Q3. Note that the capacitor C4 has a role of cutting the direct current component in the end-to-end voltage of the resistor R7. In a case where this direct current component does not affect the operation of the FET Q3 much, the capacitor C4 may be omitted. The reason that the direct-current voltage from the voltage generation unit 503 is divided by the resistor R10 and the resistor R11 and the output voltage is applied to the gate of the FET Q3 is that this reduces the effect of the diode D4 and the capacitor C3 of the voltage generation unit 503. Thereby, the voltage detection precision improves.

FIG. 6A illustrates the waveform W1 of the alternating-current voltage, the waveform W2 of the voltage applied to the gate of the FET Q3, and the waveform W3 of the pulse signal in the second embodiment. The alternating-current voltage from the division in the level detection unit 501 and the output voltage of the timing adjusting unit 502 are added by the resistor R7. As the waveform W2 illustrates, the waveform of the voltage applied to the gate is a waveform resulting from increasing the amplitude of part of a sinusoidal wave. By adding the output voltage of the timing adjusting unit 502 to the output voltage of the level detection unit 501, the timing at which the FET Q3 ceases to conduct electricity is adjusted to be after the timing at which the light emitting diode D1 ceases to conduct electricity. Because the light emitting diode D1 and the FET Q3 are connected in series, the rising edge of the pulse signal is generated by the light emitting diode D1 ceasing to conduct electricity, and the falling edge is generated by the FET Q3 conducting electricity.

FIG. 6B illustrates voltage waveforms W1 through W3 where the voltage of the commercial alternating current power supply AC is caused to change in four 20V increments in the range from 80V to 140V. The timing at which the rising edge generated by the light emitting diode D1 ceases to conduct electricity does not change much even though the voltage level of the commercial alternating current power supply AC changes. Meanwhile, the timing at which the gate voltage of the FET Q3 exceeds the gate threshold of the FET Q3 changes greatly depending on the voltage level of the commercial alternating current power supply AC. In other words, the timing of the falling edge changes greatly depending on the voltage level of the commercial alternating current power supply AC. Also, since the pulse width changes greatly depending on the voltage level of the commercial alternating current power supply AC, the dynamic range of the voltage that is detected widens.

FIG. 6C illustrates a relationship between the effective value of the alternating-current voltage and the pulse width. In the second embodiment, the voltage applied to the gate terminal of the FET Q3 is designed to depend substantially on resistors only. As can be seen from the fact that the difference in PW1, PW2, and PW3 becomes smaller, in the second embodiment, the variation in results of voltage detection by the circuit component is significantly suppressed as compared to the first embodiment. Also, the difference in the voltage level of the commercial alternating current power supply AC is represented by the sum of two pieces of information: the gradient (dv/dt) of the voltage and the direct-current voltage generated by the voltage generation unit 503. Accordingly, the amount of change in the pulse width in relation to the change in voltage of the commercial alternating current power supply AC in the second embodiment becomes larger as compared to in the first embodiment.

In this way, the voltage generation unit 503 fulfills a role of causing the voltage detection precision to improve by making larger the amount of change in the pulse width in relation to the change in voltage of the commercial alternating current power supply AC. However, the voltage generation unit 503 is not essential and may be omitted. It may be determined whether the voltage generation unit 503 is necessary or not in accordance with what degree of dynamic range in voltage detection is necessary.

Third Embodiment

In a third embodiment, an edge indicating a zero cross and an edge indicating a voltage level of the alternating-current voltage are each generated by a FET. In other words, by making the rising edge a steeper edge, the detection precision of the zero cross is improved.

Figure 7:
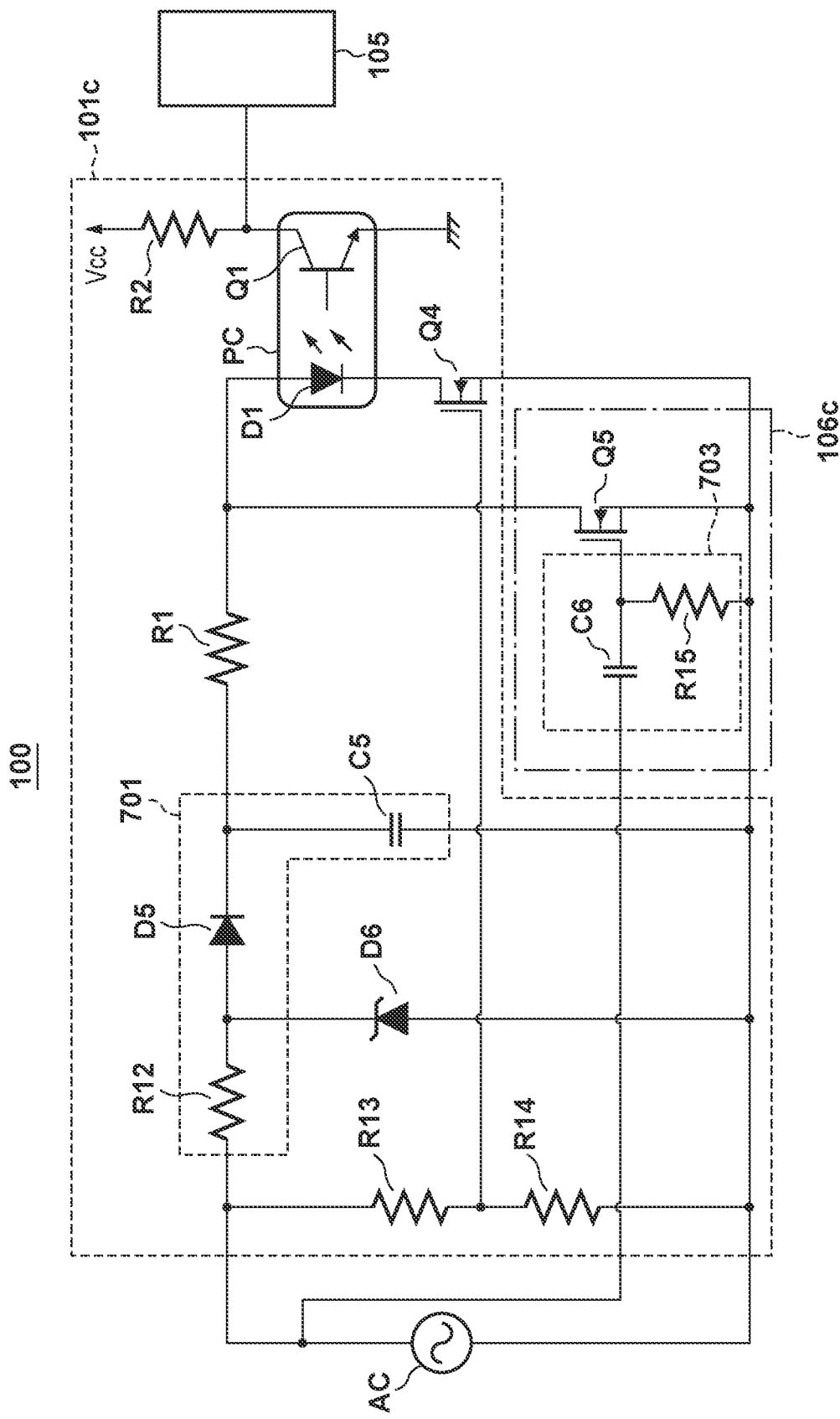
FIG. 7 is a view illustrating a detection apparatus in a third embodiment.

FIG. 7 illustrates the detection apparatus 100 of the third embodiment. The alternating-current voltage of the commercial alternating current power supply AC is applied to a rectification smoothing circuit 701. A half wave rectification is performed on the alternating current by a resistor R12 and a diode D5 in the rectification smoothing circuit 701 resulting in a pulsating flow, and the pulsating flow is converted into a direct current by smoothing by a capacitor C5. The direct-current voltage that is produced between the two ends of the capacitor C5 functions as a voltage source of the photocoupler PC. The direct-current voltage is applied to the anode of the light emitting diode D1 of the photocoupler PC via a current-limiting resistor R1 and a FET Q4. Accordingly, the light emitting diode D1 of the third embodiment is kept in a state in which it can conduct electricity at all times, and the light emitting diode D1 does not function as a direct switch element for creating an edge. In other words, whether the FET Q4, which is connected in series with the diode D1, conducts or does not conduct electricity controls whether the light emitting diode D1 conducts or does not conduct electricity. The transient response for whether the FET Q4 conducts or does not conduct electricity is typically fast compared to the transient response of the light emitting diode D1. Accordingly, in the third embodiment, the rising edge of the pulse signal becomes steep compared to in the first embodiment. By making the rising edge a steep edge, the effect of variation in the voltage detection threshold in the input port 104 on edge detection becomes smaller. The result of this is that zero cross detection precision becomes higher.

A resistor R13 and a resistor R14 form a voltage-dividing circuit that divides an alternating-current voltage supplied from the commercial alternating current power supply AC. The voltage generated by the resistor R13 and the resistor R14 is applied to the gate of the FET Q4. The FET Q4 operates so as to form a rising edge which indicates the zero cross timing of the alternating-current voltage of the commercial alternating current power supply AC. Accordingly, the FET Q4 whose gate voltage is on the order of several V is selected.

A Zener diode D6 conducts electricity when a forward current flows therethrough when the alternating-current voltage from the commercial alternating current power supply AC is a negative voltage. Thereby, a negative voltage of the capacitor C5 is suppressed to the forward voltage of the Zener diode D6. When the alternating-current voltage of the commercial alternating current power supply AC is a positive voltage, the Zener diode D6 suppresses the positive voltage of the capacitor C5 to a breakdown voltage. This is particularly useful when a high voltage that is outside specifications is outputted from the commercial alternating current power supply AC. A voltage detection unit 106c is configured by a high-pass filter (HPF) 703 and an FET Q5. The HPF 703 is configured by a capacitor C6 and a resistor R15. The HPF 703 generates a voltage correlated with the alternating-current voltage and having a phase that is more advanced than the phase of the alternating-current voltage. The FET Q5 can turn off the light emitting diode D1 forcibly because the FET Q5 is connected with the light emitting diode D1 in parallel. The voltage detection unit 106c forms a rising edge by the FET Q5 conducting electricity in accordance with the voltage level of the alternating-current voltage.

FIG. 8A illustrates a state of each voltage waveform W1 to W3 and the FET Q5 in the third embodiment. Note that W2 is a voltage waveform of a voltage applied to the FET Q5. W6 indicates whether the FET Q5 conducts electricity (ON) or does not conduct electricity (OFF). The FET Q4 enters a conductive state when the voltage of the commercial alternating current power supply AC exceeds a predetermined voltage. Accordingly, when, at the zero cross timing, the FET Q4 switches from conducting electricity to not conducting electricity, the light emitting diode D1 turns off, and a rising edge is formed.

The FET Q4 is connected in parallel with the FET Q5. Accordingly, only when the FET Q5 is in a non-conductive state is a forward voltage applied to the light emitting diode D1 and the FET Q4 able to form a rising edge. As FIG. 8A illustrates, when a zero cross occurs in the voltage waveform W1 when the FET Q5 is in a non-conductive state (OFF), the FET Q4 switches from a conductive state to a non-conductive state, and the rising edge is formed. As FIG. 8A illustrates, when the FET Q5 is in a conductive state (ON), the rising edge is not formed even if a zero cross occurs.

As described above, the phase advances by the alternating-current voltage of the commercial alternating current power supply AC passing through the HPF 703. The cut-off frequency of the HPF 703 is set so that the phase of the alternating-current voltage advances by between several tens of degrees and 90 degrees approximately in the range from 50 Hz to 60 Hz which is the frequency of the alternating-current voltage. The waveform of the alternating-current voltage of the commercial alternating current power supply AC becomes the voltage waveform W2 by passing through the HPF 703. When the gate voltage whose phase is advanced due to passing through the HPF 703 exceeds the gate threshold (example: 3V), between the drain and the source of the FET Q5 transitions from a non-conductive state and a conductive state. By the HPF 703 advancing the phase of the voltage, the conductive timing and non-conductive timing of the FET Q5 advance in relation to those of the FET Q4 respectively. In the third embodiment, the diode D1 turns off and a rising edge indicating a zero cross is formed by the FET Q4 transitioning from a conductive state to a non-conductive state. Accordingly, the state of the FET Q5 must be a non-conductive state when the FET Q4 transitions from a conductive state to a non-conductive state. Accordingly, by the HPF 703, the timing at which the FET Q5 transitions into a non-conductive state is made to be earlier than when the FET Q4 transitions into a non-conductive state. Also, a falling edge for notifying the voltage level is formed when the light emitting diode D1 turns on due to the FET Q5 transitioning from a conductive state into a non-conductive state. Accordingly, the state of the FET Q5 must be a conductive state when the FET Q4 transitions from a conductive state to a non-conductive state. Since, by the HPF 703, the timing at which the FET Q5 transitions into a non-conductive state is made to be earlier than when the FET Q4 transitions into a non-conductive state, this condition is also satisfied.

FIG. 8B illustrates voltage waveforms W1 through W3 where the voltage of the commercial alternating current power supply AC is caused to change in four 20V increments in the range from 80V to 140V. The timing of the rising edge generated by the FET Q4 ceasing to conduct electricity does not change much even though the voltage level of the commercial alternating current power supply AC changes. Meanwhile, the timing at which the gate voltage of the FET Q5 exceeds the gate threshold changes greatly depending on the voltage of the commercial alternating current power supply AC. That is, the timing of the falling edge generated by the FET Q5 ceasing to conduct electricity changes greatly according to the voltage of the commercial alternating current power supply AC. Note that, the timing at which the FET Q5 begins to conduct electricity changes greatly depending on the voltage of the commercial alternating current power supply AC. Because the HPF 703 is designed so that the FET Q4 invariably does not conduct electricity when the FET Q5 begins to conduct electricity, the pulse signal does not depend on the timing at which the FET Q5 begins to conduct electricity.

In the third embodiment, the capacitor C5 is being used in the voltage detection unit 106c similarly to in the first embodiment. Accordingly, the voltage detection result is easily influenced by variation in the capacitor C5. Accordingly, a variable resistor may be employed as the resistor R15. Voltage detection precision increases by setting the resistance value of the variable resistor so as to reduce variation in the capacitance of the capacitor C5.

Fourth Embodiment

The fourth embodiment increases voltage detection precision by combining the zero cross detection unit of the third embodiment and the voltage detection unit of the second embodiment. In the third embodiment, the HPF 703 of the voltage detection unit 106c is interposed in relation to the gate of the FET Q5, and therefore the falling edge is influenced by the HPF 703. Accordingly, in the fourth embodiment, in place of the voltage detection unit 106c, a voltage detection unit similar to the voltage detection unit 106b of the second embodiment is employed.

Figure 9:
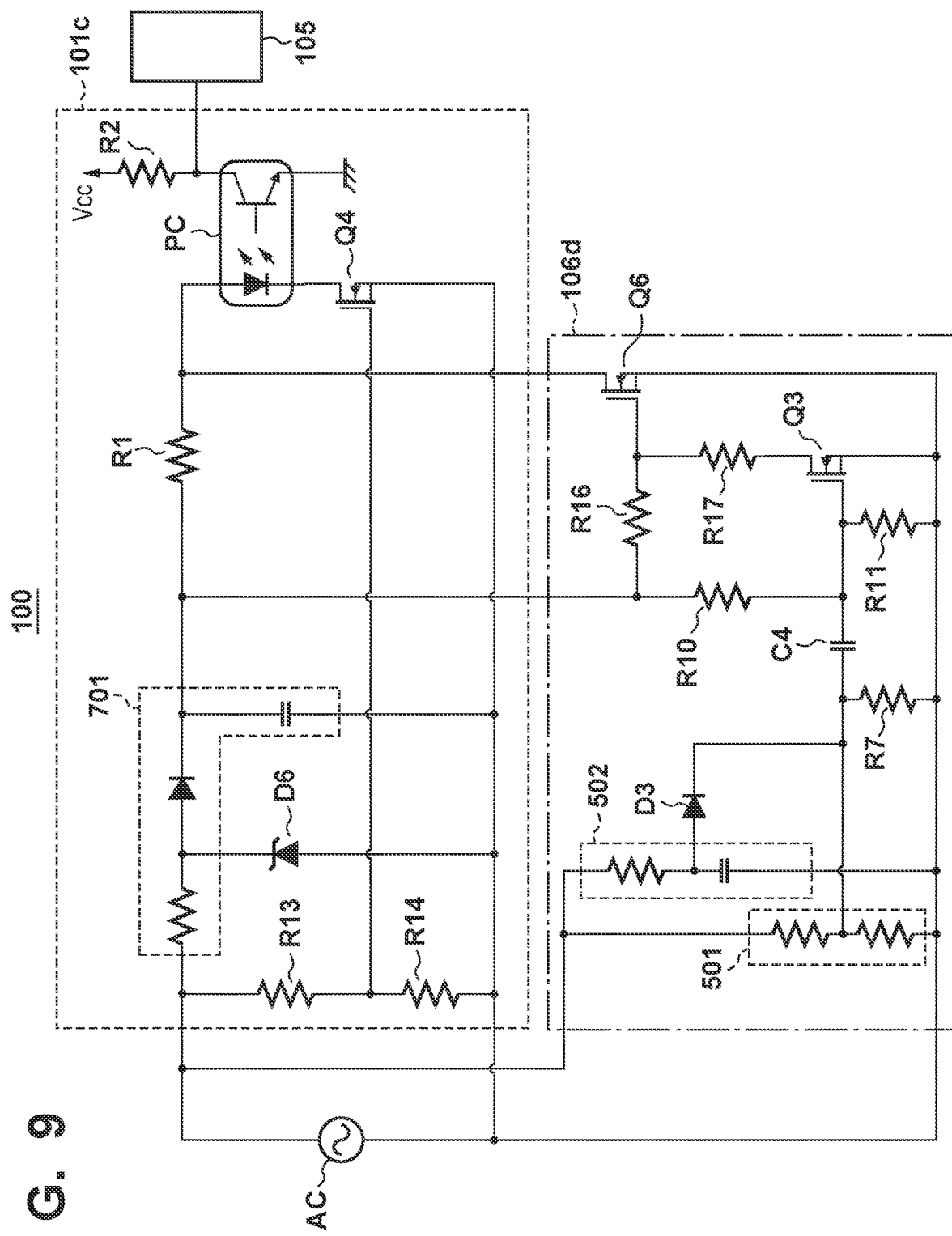
FIG. 9 is a view illustrating a detection apparatus in a fourth embodiment.

FIG. 9 illustrates the detection apparatus 100 of the fourth embodiment. A zero cross detection unit 101c is the same as the zero cross detection unit used in the third embodiment. A voltage detection unit 106d is formed by modifying part of the voltage detection unit 106b of the second embodiment. As FIG. 9 illustrates, the zero cross detection unit 101c has the rectification smoothing circuit 701 that functions as a voltage generation unit for generating a direct-current voltage. Accordingly, the voltage generation unit 503 illustrated in FIG. 5 is unnecessary. The direct-current voltage generated by the rectification smoothing circuit 701 is applied to the gate terminal of a FET Q6 via a resistor R16. Because this direct-current voltage is a voltage that exceeds the gate threshold of the FET Q6, the FET Q6 is kept in a state in which it can conduct electricity at all times. The drain terminal of the FET Q3 is connected to the gate terminal of the FET Q6 via a current-limiting resistor R17. The FET Q3 and the FET Q6 substantially form an inversion circuit. If the state of the FET Q3 is a conductive state, the gate voltage of the FET Q6 becomes less than or equal to the gate threshold, and the state of the FET Q6 is a non-conductive state. Meanwhile, if the state of the FET Q3 is a non-conductive state, the gate voltage of the FET Q6 exceeds the gate threshold, and the state of the FET Q6 is a conductive state. In this way, because the FET Q6 is connected in parallel with the light emitting diode D1 and the FET Q4, it contributes to forming the falling edge similarly to the FET Q5 in the fourth embodiment.

FIG. 10A illustrates voltage waveforms in the fourth embodiment. W2 is a voltage waveform of a gate voltage of the FET Q3. W10 is a voltage waveform of a gate voltage of the FET Q6. As FIG. 9 illustrates, the FET Q4 and the FET Q6 are connected in parallel to the commercial alternating current power supply AC. When the FET Q4 is in a conductive state, the light emitting diode D1 turns on and the falling edge is generated by the FET Q6 transitioning from a conductive state to a non-conductive state. Thereby, the voltage level of the alternating-current voltage is transferred to the microcomputer 105. Note that the FET Q6 is kept in a state in which it can conduct electricity at all times. Accordingly, the state of the FET Q6 is controlled by the FET Q3. During a period when the FET Q3 is in a conductive state, the FET Q6 is kept in a non-conductive state. In other words, as the voltage waveforms W2 and W3 illustrate, when the gate voltage of the FET Q3 exceeds the gate threshold, the FET Q6 transitions into a non-conductive state. Also, when the gate voltage of the FET Q3 becomes less than or equal to the gate threshold, the FET Q6 transitions into a conductive state.

When the FET Q6 is in a non-conductive state, the gate voltage of the FET Q4 less than or equal to the gate threshold, and thereby the FET Q4 transitions from a conductive state into a non-conductive state, the light emitting diode D1 turns off, and the rising edge is formed. Thereby, the zero cross timing of the alternating-current voltage is transferred to the microcomputer 105.

FIG. 10B illustrates voltage waveforms W1, W2, and W10 which are for when the voltage of the commercial alternating current power supply AC is caused to change in four 20V increments in the range from 80V to 140V. The position of the rising edge generated by the FET Q4 ceasing to conduct electricity does not change much even though the voltage level of the commercial alternating current power supply AC changes. Meanwhile, the timing at which the gate voltage of the FET Q6 becomes less than or equal to the gate threshold changes greatly depending on the voltage of the commercial alternating current power supply AC. The position of the falling edge generated by the FET Q6 transitioning from a conductive state to a non-conductive state changes greatly depending on the voltage of the commercial alternating current power supply AC. In the fourth embodiment, the timing at which the gate voltage of the FET Q6 becomes less than or equal to the gate threshold substantially only depends on resistors. The resistors are circuit elements for which resistance value variation is typically small, but capacitors and coils are circuit elements for which capacitance value and inductance value variation is large. Such circuit element variation lowers voltage detection precision.

Only resistors are interposed in the fourth embodiment, and no capacitors or coils are interposed. Accordingly, in the fourth embodiment, it is possible to detect the commercial alternating current power supply AC voltage at higher precision compared to the third embodiment.

Fifth Embodiment

Figure 11:
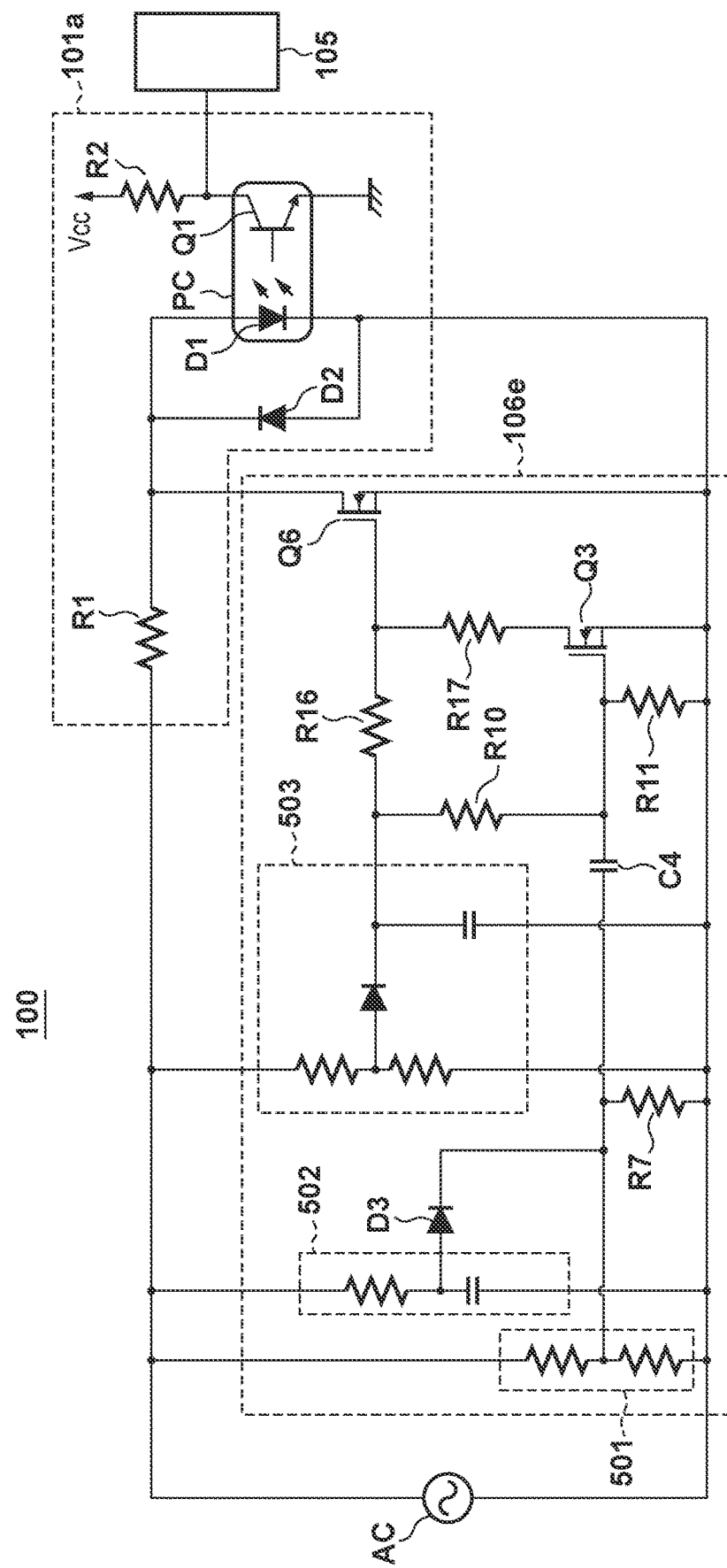
FIG. 11 is a view illustrating a detection apparatus in a fifth embodiment.

In the fifth embodiment, the driving source of the photocoupler PC in the fourth embodiment is changed from a direct-current voltage to an alternating-current voltage. FIG. 11 illustrates the detection apparatus 100 of the fifth embodiment. The zero cross detection unit 101a is the same as the zero cross detection unit used in the first embodiment and the second embodiment. A voltage detection 106e is formed by combining the voltage generation unit 503 of the second embodiment with the voltage detection unit 106d of the fourth embodiment. Specifically, the direct-current voltage generated by the voltage generation unit 503 is provided via the resistor R16 to the gate terminal of the FET Q6. The direct-current voltage generated by the voltage generation unit 503 is set to a voltage that is higher than the gate threshold of the FET Q6. Accordingly, the FET Q6 is kept in a state in which it can conduct electricity at all times. The drain of the FET Q3 is connected to the gate terminal of the FET Q6 via the current-limiting resistor R17. Accordingly, if the FET Q3 transitions into a conductive state, the gate voltage of the FET Q6 becomes less than or equal to the gate threshold, and the state of the FET Q6 transitions into a non-conductive state.

FIG. 12A illustrates voltage waveforms W1, W2, and W10 according to the fifth embodiment. It can be seen, comparing to FIG. 10A, that the voltage waveforms W1, W2, and W10 are the same in FIG. 12A. In other words, the circuit configuration of the zero cross detection unit 101a does not influence the operation of the voltage detection 106e.

In the fifth embodiment, control of whether the light emitting diode D1 of the photocoupler PC conducts electricity or does not conduct electricity is controlled by the light emitting diode D1 itself. Accordingly, the gradient of the rising edge of the pulse signal in the fifth embodiment is smoother than the gradient of the rising edge of the fourth embodiment.

FIG. 12B illustrates voltage waveforms W1, W2, and W10 where the voltage of the commercial alternating current power supply AC is caused to change in four 20V increments in the range from 80V to 140V. In the first embodiment and the second embodiment, the FETs Q2 and Q3 which generate the falling edge of the pulse signal are connected to the commercial alternating current power supply AC. Meanwhile, the gate of the FET Q3 that controls the timing of the falling edge in the fifth embodiment is connected to the output of the voltage generation unit 503 (several V to several tens of V). Accordingly, it is possible to employ a FET whose tolerable voltage is lower than that of the FETs in the first embodiment and the second embodiment as the FET Q3. Note that in place of the FET Q3, a shunt regulator with low tolerable voltage and low threshold voltage variation may also be employed. Thereby, the voltage detection precision of the commercial alternating current power supply AC is further improved.

Sixth Embodiment

Figure 13:
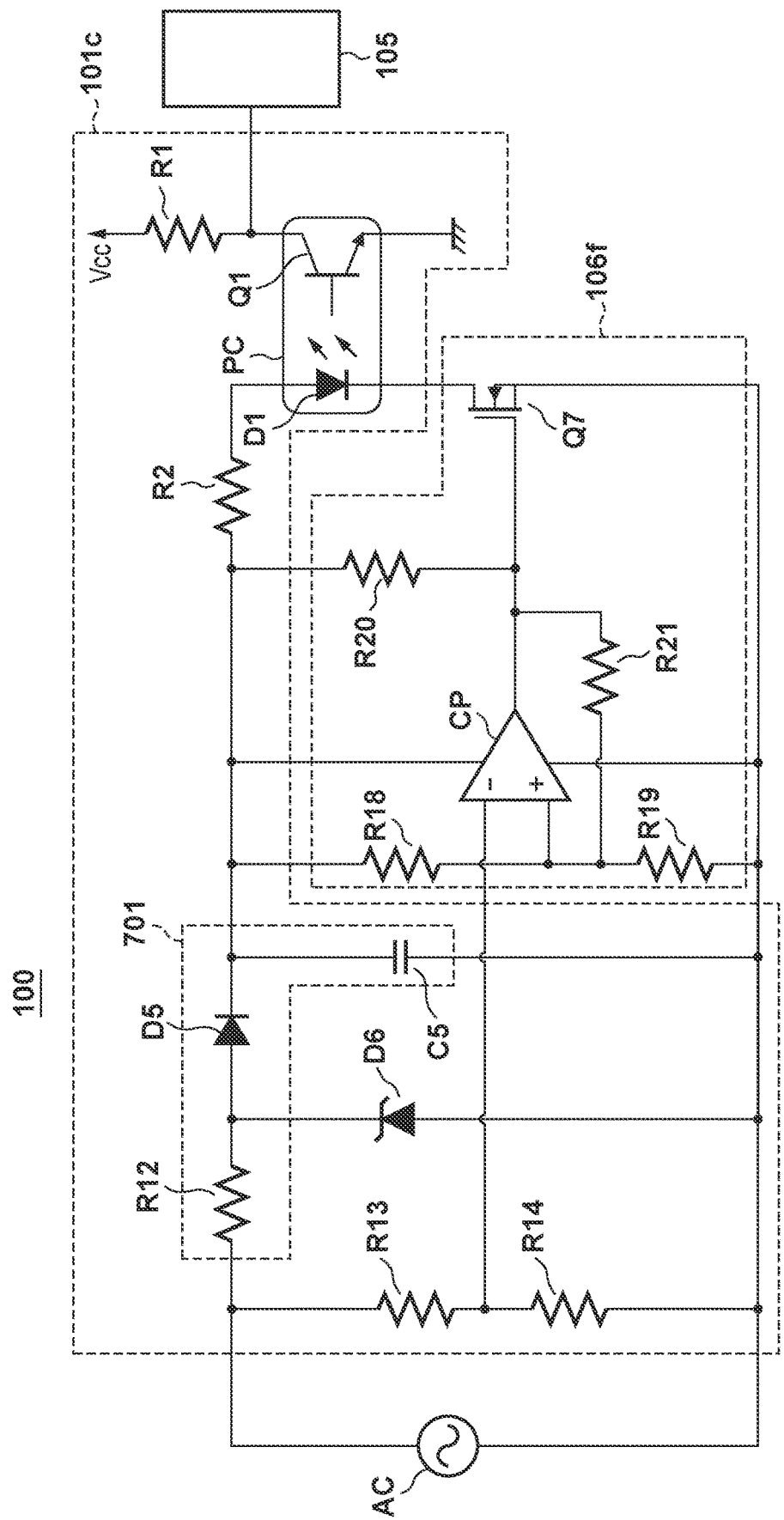
FIG. 13 is a view illustrating a detection apparatus in a sixth embodiment.

The sixth embodiment employs a configuration that combines the zero cross detection unit 101c used in the third and fourth embodiments and a voltage detection unit which has hysteresis characteristics. FIG. 13 illustrates the detection apparatus 100 of the sixth embodiment. A voltage detection unit 106f has a comparator CP which has hysteresis characteristics. A resistor R18 and a resistor R19 are a voltage-dividing circuit that divides the direct-current voltage generated by the rectification smoothing circuit 701 and applies the output voltage to a non-inverting input terminal (+ terminal) of the comparator CP. This becomes a reference voltage of the comparator CP. The aforementioned resistor R13 and resistor R14 are a voltage-dividing circuit that divides the alternating-current voltage of the commercial alternating current power supply AC and applies the output voltage to an inverting input terminal (− terminal) of the comparator CP. The reference voltage inputted into the non-inverting input terminal (+ terminal) is a voltage that corresponds to the alternating-current voltage 85V (≈60V×√2) of the commercial alternating current power supply AC, for example. This is for causing the load 320, which may be an AC/DC converter, to stop when the alternating-current voltage becomes less than 85V. Accordingly, the reference voltage may be set in accordance with the load.

FIG. 14A illustrates voltage waveforms in the sixth embodiment. W13 indicates a voltage waveform of a gate voltage of a FET Q7. W14 indicates an output state of the comparator CP. Output of the comparator CP becomes a high impedance (Hiz) in a case where the voltage of the commercial alternating current power supply AC is less than 85V. In a case where the output of the comparator CP is Hiz, a direct-current voltage is applied by a pull-up resistor R20 to the gate terminal of the FET Q7. Thereby, the FET Q7 enters a conductive state. When the FET Q7 enters a conductive state, the light emitting diode D1 turns on, and the pulse signal becomes a low level. In the sixth embodiment, a falling edge indicates a zero cross timing.

In a case where the voltage of the commercial alternating current power supply AC is +85V or more, the output of the comparator CP is approximately 0V (L), and therefore the FET Q7 is in a non-conductive state. When the FET Q7 enters a non-conductive state, the light emitting diode D1 turns on, and the pulse signal becomes a high level. In the sixth embodiment, the rising edge indicates the voltage level.

When the output of the comparator CP becomes L, it is equivalent to a state in which the resistor R21 is connected to the resistor R19 in parallel. The resistance value of the resistor R21 is set to be sufficiently low as compared to the resistance value of the resistor R19. Accordingly, the reference voltage inputted into the non-inverting input terminal (+ terminal) in a case where the output of the comparator CP became L becomes a voltage that corresponds to approximately 0V in the voltage of the commercial alternating current power supply AC. The output of the comparator CP that once outputted L does not reverse to Hiz again when the voltage of the commercial alternating current power supply AC does not decrease to approximately 0V. In other words, the operation of the comparator CP is that the output is L in a case where the voltage of the commercial alternating current power supply AC is 85V or more and there are hysteresis characteristics such as outputting Hiz in a case where the voltage of the commercial alternating current power supply AC is approximately 0V or less.

FIG. 14B illustrates voltage waveforms W1, W3, and W13 where the voltage of the commercial alternating current power supply AC is caused to change in four 20V increments in the range from 80V to 140V. By the hysteresis characteristics of the comparator CP, the rising edge changes in accordance with the voltage of the commercial alternating current power supply AC, and the falling edge does not depend on the voltage of the commercial alternating current power supply AC. In this way, in the sixth embodiment, the information that the rising edge conveys and the information that the falling edge conveys differ from in the first embodiment through to the fifth embodiment.

In the first embodiment through to the fifth embodiment, an element that generates the falling edge and an element that generates the rising edge are provided separately. In the sixth embodiment, the falling edge and the rising edge can be generated by the FET Q7 on its own. Accordingly, the sixth embodiment can reduce the number of switch elements as compared to the third embodiment through to the fifth embodiment.

Seventh Embodiment

Figure 15:
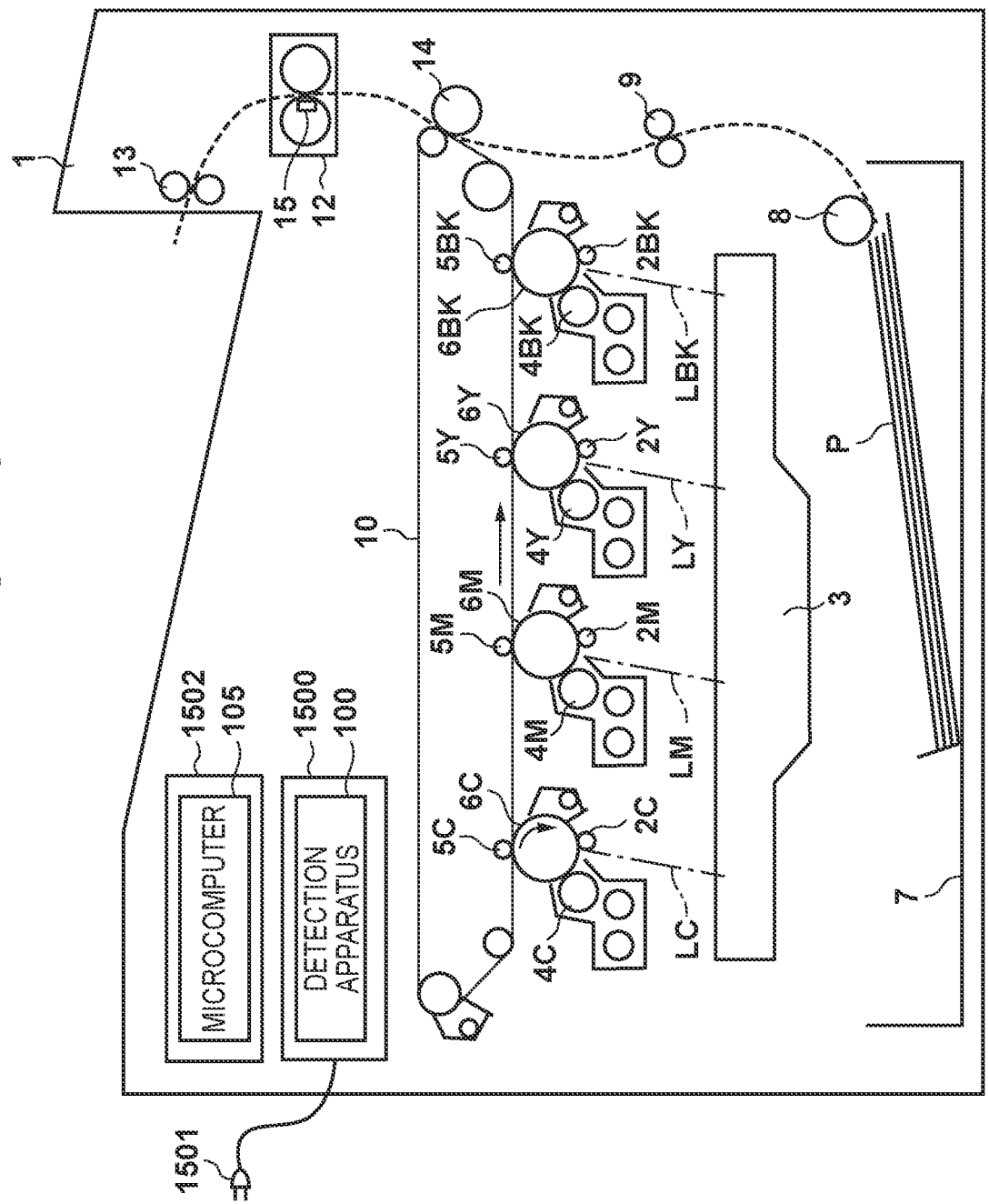
FIG. 15 is a view for illustrating an image forming apparatus.

FIG. 15 illustrates an intermediate transfer method image forming apparatus 1 to which the detection apparatus 100 and the microcomputer 105 can be applied. The image forming apparatus 1 may be an image forming apparatus for forming a monochrome image, but here it is an electrophotographic type image forming apparatus that forms a multicolor image by color mixing of a plurality of colorants. The image forming apparatus 1 uses toner of four colors such as yellow (Y), magenta (M), cyan (C), and black (BK). Characters indicating a color are added to the end of reference numerals in FIG. 15, but these characters are omitted when matters common to the four colors are explained.

Photosensitive drums 6C, 6M, 6Y, and 6BK are arranged at regular intervals to each other, and are image carriers for carrying an electrostatic latent image or a toner image. An engine controller 1502 has the microcomputer 105, and controls a power supply apparatus 1500 that the image forming apparatus 1 comprises and the load 320 such as a motor, an actuator, a solenoid, a sensor, a heater 15, or the like. The power supply apparatus 1500 is connected via a power supply cable 1501 to the commercial alternating current power supply AC. The power supply cable 1501 functions as an input unit of the alternating-current voltage. The power supply apparatus 1500 has the detection apparatus 100, an AC/DC converter, a DC/DC converter, or the like.

A primary charger 2 charges the surface of a photosensitive drum 6 uniformly by using a charge voltage supplied from the power supply apparatus 1500. An optical scanning apparatus 3 emits toward the photosensitive drums 6 a light beam (a laser beam) L that is respectively modulated based on an input image. The light beam (laser beam) L forms an electrostatic latent image on the surface of the photosensitive drum 6. The engine controller 1502 controls the power supply apparatus 1500 to generate a developing voltage, and supplies the developing voltage to a developer 4. The developers 4 respectively cause cyan, magenta, yellow, and black toner to adhere to the electrostatic latent image, through a sleeve or a blade to which the developing voltage is applied. By this, the electrostatic latent image is developed and a developer image (a toner image) is formed.

A sheet feed roller 8 is driven by a motor or a solenoid that is controlled by the microcomputer 105. The sheet feed roller 8 feeds sheets P that are accommodated in a feeding tray 7 one at a time. A registration roller 9 is driven by a motor that is controlled by the microcomputer 105. The registration roller 9 feeds sheets P to a secondary transfer unit in synchronism with an image write start timing.

The engine controller 1502 controls the power supply apparatus 1500 to generate a primary transfer voltage, and supplies the primary transfer voltage to a primary transfer roller 5. The primary transfer roller 5 primary transfers the toner image carried by the photosensitive drum 6 onto an intermediate transfer belt 10. The primary transfer voltage applied to the primary transfer roller 5 promotes the primary transfer of the toner image. The intermediate transfer belt 10 functions as an intermediate transfer body. A driving roller 11 is a roller that causes the intermediate transfer belt 10 to rotate. A secondary transfer unit has a secondary transfer roller 14. The engine controller 1502 controls the power supply apparatus 1500 to generate a secondary transfer voltage, and supplies the secondary transfer roller 14. In the secondary transfer unit, by the intermediate transfer belt 10 and the secondary transfer roller 14 conveying while pinching the sheet P, the multicolor toner image carried on the intermediate transfer belt 10 is secondary transferred to the sheet P. The secondary transfer voltage promotes the secondary transfer. After this, the sheets P are conveyed to a fixing device 12. The fixing device 12 applies heat and pressure to the toner image carried on the sheet P to cause fixing. A discharging roller 13 discharges the sheet P on which the image is formed. The fixing device 12 has the heater 15, and temperature is controlled by the microcomputer 105. The microcomputer 105 controls the power supplied by the heater 15 by controlling the aforementioned wave number.

Summary

As explained using the first to sixth embodiments, the detection apparatus 100 generates a superimposition signal in which information indicating a timing of a zero cross in an alternating-current voltage and information indicating a voltage level of the alternating-current voltage are superimposed. Thereby it becomes possible to reduce the number of signal lines for transferring the zero cross timing and the voltage level. For example, the detection apparatus 100 may have a pulse generation circuit that generates, as a superimposition signal, a pulse signal including a first edge that indicates a timing of a zero cross in an alternating-current voltage and a second edge for which a time interval in relation to the first edge changes in accordance with the voltage level of the alternating-current voltage.

This kind of pulse generation circuit has a first edge circuit that generates the first edge at a timing of a zero cross and a second edge circuit that generates the second edge at a timing according to a gradient of the alternating-current voltage. The zero cross detection units 101*a* and 101*c* are examples of the first edge circuit. Also, the voltage detection unit 106*a* and 106*f* are examples of the second edge circuit. The first edge circuit generates a first edge when the voltage level of the alternating-current voltage is a first level. As described using FIG. 2A and the like, the first level is the forward voltage VF of the light emitting diode D1 or the like. The first level in FIG. 7 is the gate threshold of the FET Q4. As described above, the forward voltage VF is sufficiently small compared to the effective value of the alternating-current voltage, and can be estimated to be about 0V. Accordingly, a zero cross point is detected accurately.

As described using FIG. 2B and the like, the second edge circuit detects a second level which is a voltage level of the alternating-current voltage or a voltage correlated to the alternating-current voltage, and generates a second edge in accordance with the second level. The second level is a gate threshold of the FET Q2 or the like. The gradient of the alternating-current voltage changes in accordance with the voltage level of the alternating-current voltage. In other words, it changes in accordance with the timing at which the voltage correlated to the alternating-current voltage exceeds the gate threshold and the voltage level of the alternating-current voltage. By using such a switch element property, the voltage level is reflected in the second edge.

As illustrated in FIG. 1, the first edge circuit has a first switch element that conducts electricity when the alternating-current voltage exceeds the threshold, and does not conduct electricity if the alternating-current voltage does not exceed the threshold. The light emitting diode D1 is one example of the first switch element. The second edge circuit has a delay circuit and a second switch element. The delay circuit is a circuit for delaying the phase of the alternating-current voltage. The second switch element is a switch element that has a control terminal to which an alternating-current voltage whose phase is delayed is applied and that switches between a conductive state and a non-conductive state in accordance with the voltage applied to the control terminal. A gate terminal is an example of the control terminal. The level detection unit 107 that configures the low-pass filter is one example of the delay circuit. The FET Q2 is one example of the second switch element. As FIG. 1 illustrates, the first switch element and the second switch element are connected in series. As FIG. 2B illustrates, the first edge circuit generates a first edge that indicates the timing of a zero cross by the first switch element not conducting electricity. As FIG. 2A illustrates, the second edge circuit generates a second edge that indicates the voltage level by the second switch element changing from a non-conductive state to a state in which it can conduct electricity in accordance with the voltage level of the alternating-current voltage when the first switch element is in a conductive state. Here, the first edge is a rising edge generated by the pulse signal switching from low level to high level. Here, the second edge is a falling edge generated by a switch from high level to low level. The relationship between these edges may be inverted.

As described in the second embodiment, the first edge circuit has a first switch element that conducts electricity when the alternating-current voltage exceeds the threshold, and does not conduct electricity if the alternating-current voltage does not exceed the threshold. The second edge circuit may have a first voltage dividing unit, a delay circuit, an addition circuit, a second switch element, or the like. As FIG. 5 illustrates, the voltage detection unit 106*b* is an example of the second edge circuit. The level detection unit 501 is one example of a first voltage dividing unit that generates a voltage that correlates to the alternating-current voltage by dividing the alternating-current voltage. The timing adjusting unit 502 is one example of a delay circuit that delays the phase of the alternating-current voltage. The resistor R7 is one example of an addition circuit that adds the voltage outputted from the first voltage dividing unit and the voltage outputted from the delay circuit. The FET Q3 is one example of the second switch element which has a control terminal to which the voltage outputted from the addition circuit is applied and that switches between a conductive state and a non-conductive state in accordance with the voltage applied to the control terminal. In the second embodiment as well, the first switch element and the second switch element are connected in series. As illustrated in FIG. 6B, the first edge circuit generates a first edge that indicates the timing of a zero cross by the first switch element not conducting electricity. The second edge circuit generates a second edge that indicates a voltage level by the second switch element changing from a non-conductive state to a conductive state in accordance with the voltage level of the voltage outputted from the addition circuit when the first switch element is conducting electricity.

As described in the second embodiment, the second edge circuit may have a rectification smoothing circuit that generates a direct-current voltage by rectification and smoothing of the alternating-current voltage, and applies the direct-current voltage to the control terminal of the second switch element. The voltage generation unit 503 is one example of the rectification smoothing circuit. By employing such a rectification smoothing circuit, the detection precision of the voltage level is further improved. As described in the second embodiment, the voltage generation unit 503 may have a second voltage dividing unit that divides the direct-current voltage and applies it to the control terminal of the second switch element. As FIG. 5 illustrates, the resistor R8 and the resistor R9 are one example of the second voltage dividing unit.

As the third embodiment illustrates, the first edge circuit may be realized by the zero cross detection unit 101c. The rectification smoothing circuit 701 is one example of a rectification smoothing circuit that generates a direct-current voltage by rectification and smoothing the alternating-current voltage. The FET Q4 is one example of a first switch element that has a control terminal that operates by being supplied direct-current voltage and to which a voltage correlated with the alternating-current voltage is applied, and that conducts electricity when the voltage correlated to the alternating-current voltage exceeds a threshold, and does not conduct electricity if the voltage correlated to the alternating-current voltage does not exceed the threshold. The second edge circuit may be realized by the voltage detection unit 106c. The HPF 703 is one example of a phase circuit that advances the phase of the alternating-current voltage. The FET Q5 is one example of a second switch element which has a control terminal to which the alternating-current voltage whose phase was advanced by the phase circuit is applied and that switches between a conductive state and a non-conductive state in accordance with the voltage applied to the control terminal. As FIG. 7 illustrates, the first switch element and the second switch element are connected in parallel. The zero cross detection unit 101c generates the first edge which indicates the timing of the zero cross by the first switch element transitioning from a conductive state to a non-conductive state. As FIG. 8A illustrates, the voltage detection unit 106c generates a second edge which indicates the voltage level by the second switch element transitioning to a non-conductive state from a conductive state in accordance with the voltage level of the alternating-current voltage at a time when the first switch element is in a state in which it can conduct electricity. As FIG. 7 illustrates, the first switch element may be formed by a series connection between the light emitting diode D1 which is a rectification element and the FET Q4 which is a semiconductor switch.

As described in the fourth embodiment, the first edge circuit may be realized by the zero cross detection unit 101c. The second edge circuit may be realized by the voltage detection unit 106d. As FIG. 9 illustrates, the level detection unit 501 is one example of a first voltage dividing unit that generates a voltage that correlates to the alternating-current voltage by dividing the alternating-current voltage. The timing adjusting unit 502 is one example of a delay circuit that delays the phase of the alternating-current voltage. The resistor R7 is one example of an addition circuit that adds the voltage outputted from the first voltage dividing unit and the voltage outputted from the delay circuit. The FET Q3 is one example of the second switch element which has a control terminal to which the voltage outputted from the addition circuit is applied and that switches between a conductive state and a non-conductive state in accordance with the voltage applied to the control terminal. The FET Q6 is one example of a third switch element that has a control terminal to which is applied a direct-current voltage which is generated from the alternating-current voltage and for which the second switch element controls application and non-application of the direct-current voltage, and that is connected in parallel with the first switch element. The voltage detection unit 106d generates a second edge that indicates a voltage level by the third switch element transitioning from a conductive state to a non-conductive state by the second switch element transitioning from a non-conductive state to a conductive state in accordance with the voltage level of the alternating-current voltage when the first switch element is in a state in which it can conduct electricity. This is exemplified in FIG. 10A and FIG. 10B.

As described in the fifth embodiment, the first edge circuit may be the zero cross detection unit 101a. The second edge circuit may be the voltage detection 106e. As FIG. 9 illustrates, the level detection unit 501 is one example of a first voltage dividing unit that generates a voltage that correlates to the alternating-current voltage by dividing the alternating-current voltage. The timing adjusting unit 502 is a delay circuit that delays the phase of the alternating-current voltage. The resistor R7 is one example of an addition circuit that adds the voltage outputted from the first voltage dividing unit and the voltage outputted from the delay circuit. The FET Q3 is one example of the second switch element which has a control terminal to which the voltage outputted from the addition circuit is applied and that switches between a conductive state and a non-conductive state in accordance with the voltage applied to the control terminal. The FET Q6 is one example of a third switch element that has a control terminal to which is applied a direct-current voltage which is generated from the alternating-current voltage and for which the second switch element controls application and non-application of the direct-current voltage, and that is connected in parallel with the first switch element. The voltage detection 106e generates a second edge that indicates a voltage level by the third switch element transitioning from a conductive state to a non-conductive state in accordance with the second switch element transitioning from a non-conductive state to a conductive state for the voltage level of the alternating-current voltage when the first switch element is in a state in which it is conducting electricity.

As described in the sixth embodiment, the pulse generation circuit may have the FET Q7 which is a switch element and a comparator CP. The comparator CP has hysteresis characteristics, and switches between a conductive state and a non-conductive state of the switch element in accordance with a voltage that is correlated with the alternating-current voltage. As FIG. 14A illustrates, the comparator CP causes the switch element to transition from a non-conductive state to a conductive state so that the switch element generates a first edge at a zero cross timing. As FIG. 14B illustrates, the comparator CP causes the switch element to transition from a conductive state to a non-conductive state so that the second edge is generated at a timing according to the gradient of a voltage correlated with the alternating-current voltage. Note that in the sixth embodiment, the rising edge corresponds to the second edge and the falling edge corresponds to the first edge.

As FIG. 3 and FIG. 15 illustrate, the microcomputer 105 and the engine controller 1502 are examples of controllers. The input port 104 is one example of an input unit into which is inputted a pulse signal including a first edge that indicates a timing of a zero cross in an alternating-current voltage and a second edge for which a time interval in relation to the first edge changes in accordance with the voltage level of the alternating-current voltage. The second counter 304 is one example of a measurement unit that measures a time interval between a first edge and a second edge. Here, the time interval is measured from the second edge until the first edge. The voltage determination unit 305 is one example of a determination unit that determines a voltage level of an alternating-current voltage based on a time interval measured by the measurement unit. The load control unit 301 is one example of a control unit that controls a load using the zero cross timing that the first edge indicates and the voltage level. In this way, the microcomputer 105 is enabled to obtain the zero cross timing and the voltage level by a single input port 104.

As described using FIG. 15, the photosensitive drum 6 is one example of an image carrier. The primary charger 2 is one example of a charging unit for uniformly charging the image carrier. The optical scanning apparatus 3 is one example of an exposure unit for forming an electrostatic latent image by exposing an image carrier. The developer 4 is one example of a developer unit that forms a toner image by developing an electrostatic latent image. The primary transfer roller 5, the intermediate transfer belt 10 and the secondary transfer roller 14 are one example of a transfer unit for transferring a toner image to a sheet. Note that the toner image may be transferred directly to a sheet P from the photosensitive drum 6. In such a case the intermediate transfer belt 10 and the secondary transfer roller 14 are not necessary. The fixing device 12 is one example of a fixing unit that comprises a heating unit and that causes a toner image to be fixed to a sheet by heating it using the heating unit. The heater 15 is one example of the heating unit. The detection apparatus 100 is one example of a generation unit that generates a pulse signal including a first edge that indicates a timing of a zero cross in an alternating-current voltage supplied from an alternating power supply and a second edge for which a time interval in relation to the first edge changes in accordance with the voltage level of the alternating-current voltage. The microcomputer 105 is one example of a control unit that receives a pulse signal, obtains a zero cross timing of the alternating-current voltage and the voltage level of the alternating-current voltage from the pulse signal, and controls the power supplied to the heating unit based on the zero cross timing and the voltage level.

One example of a method of controlling the heating unit is a method that controls the wave number for power on/off control for each half period of the alternating-current voltage in accordance with the zero cross timing. Another example is a phase control type that supplies heat by controlling the on time in a half period of the alternating-current voltage. Note that it is possible to employ a hybrid control method that combines the wave number control method and the phase control type.

Also, a cooling fan may be employed as the load.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2017-030245, filed Feb. 21, 2017 and No. 2017-237094, filed Dec. 11, 2017, which are hereby incorporated by reference herein in their entirety.

What is claimed is:

1. A detection apparatus comprising:
an alternating-current voltage input unit;
a generation circuit configured to generate a pulse signal of which level is switched between a first level and a second level, wherein the pulse signal includes information indicating a timing of a zero cross in an alternating-current voltage inputted into the input unit and information indicating a voltage value of the alternating-current voltage, wherein the generation circuit includes a first circuit configured to switch the level of the pulse signal from the first level to the second level and a second circuit configured to switch the level of the pulse signal from the second level to the first level; and
a determination unit configured to determine the timing of the zero cross based on a first timing at which the first circuit switches the level of the pulse signal and to determine the voltage value of the alternating-current voltage based on a time period between the first timing and a second timing at which the second circuit switches the level of the pulse signal.

2. The detection apparatus according to claim 1, wherein the generation circuit including the first and the second circuits has a pulse generation circuit that generates, as the pulse signal, the pulse signal including a first edge corresponding to the rising second timing and a second edge corresponding to the fatting first timing, the first edge indicating the timing of the zero cross in the alternating-current voltage, and the second edge indicating the voltage value of the alternating-current voltage by a time interval between the first edge and the second edge changing in accordance with the voltage value of the alternating-current voltage.

3. The detection apparatus according to claim 2, wherein the first circuit has a first edge circuit that generates the first edge at the zero cross timing, and the second circuit has a second edge circuit that generates the second edge at a timing according to a gradient of the alternating-current voltage.

4. The detection apparatus according to claim 3, wherein the first edge circuit generates the first edge when the voltage value of the alternating-current voltage is a first value.

5. The detection apparatus according to claim 3, wherein the second edge circuit detects a second value which is a voltage value of the alternating-current voltage or a voltage correlated to the alternating-current voltage, and generates the second edge in accordance with the second value.

6. The detection apparatus according to claim 3, wherein the first edge circuit has a first switch element that conducts electricity when the alternating-current voltage exceeds a threshold and does not conduct electricity if the alternating-current voltage does not exceed the threshold,
the second edge circuit has a delay circuit that delays a phase of the alternating-current voltage and a second switch element that has a control terminal to which the alternating-current voltage whose phase was delayed is applied and that switches between a conductive state and a non-conductive state in accordance with the voltage applied to the control terminal,
wherein the first switch element is connected in series with the second switch element,
wherein the first edge circuit generates the first edge that indicates the timing of the zero cross by the first switch element not conducting electricity, and
wherein the second edge circuit generates the second edge that indicates the voltage value by the second switch element changing from a non-conductive state to a conductive state in accordance with the voltage value of the alternating-current voltage when the first switch element is conducting electricity.

7. The detection apparatus according to claim 3, wherein the first edge circuit has
a first switch element that conducts electricity when the alternating-current voltage exceeds a threshold and does not conduct electricity if the alternating-current voltage does not exceed the threshold,
the second edge circuit has
a first voltage dividing unit that generates a voltage that is correlated to the alternating-current voltage by dividing the alternating-current voltage;
a delay circuit that delays a phase of the alternating-current voltage;
an addition circuit that adds the voltage outputted from the first voltage dividing unit and the voltage outputted from the delay circuit; and
a second switch element that has a control terminal to which the voltage outputted from the addition circuit is applied and that switches between a conductive state and a non-conductive state in accordance with the voltage applied to the control terminal, and
the first switch element is connected in series with the second switch element,
the first edge circuit generates the first edge that indicates the timing of the zero cross by the first switch element not conducting electricity, and
the second edge circuit generates the second edge that indicates the voltage level by the second switch element changing from a non-conductive state to a conductive state in accordance with the voltage level of the voltage outputted from the addition circuit when the first switch element is conducting electricity.

8. The detection apparatus according to claim 7, wherein the second edge circuit further has
a rectification smoothing circuit that generates a direct-current voltage by rectifying and smoothing the alternating-current voltage, and applies the direct-current voltage to the control terminal of the second switch element.

9. The detection apparatus according to claim 8, wherein the rectification smoothing circuit has a second voltage dividing unit that divides the direct-current voltage and applies a result of the dividing to the control terminal of the second switch element.

10. The detection apparatus according to claim 3, wherein the first edge circuit has
a rectification smoothing circuit that generates a direct-current voltage by rectifying and smoothing the alternating-current voltage, and
a first switch element that has a control terminal that operates by being supplied the direct-current voltage and to which a voltage correlated with the alternating-current voltage is applied, and that conducts electricity when the voltage correlated to the alternating-current voltage exceeds a threshold, and does not conduct electricity if the voltage correlated to the alternating-current voltage does not exceed the threshold, and
the second edge circuit has
a phase circuit that advances a phase of the alternating-current voltage and
a second switch element that has a control terminal to which the alternating-current voltage whose phase was advanced by the phase circuit is applied and that switches between a conductive state and a non-conductive state in accordance with the voltage applied to the control terminal,
the first switch element is connected in parallel with the second switch element,
the first edge circuit generates the first edge that indicates the timing of the zero cross by the first switch element transitioning from a conductive state to a non-conductive state, and
the second edge circuit generates the second edge that indicates the voltage level by the second switch element transitioning from a conductive state to a non-conductive state in accordance with the voltage level of the alternating-current voltage when the first switch element is in a state in which the first switch element can conduct electricity.

11. The detection apparatus according to claim 10, wherein
the first switch element is formed by a series connection between a rectification element and a semiconductor switch.

12. The detection apparatus according to claim 3, wherein the first edge circuit has a rectification smoothing circuit that generates a direct-current voltage by rectifying and smoothing the alternating-current voltage, and
a first switch element that has a control terminal that operates by being supplied the direct-current voltage and to which a voltage correlated with the alternating-current voltage is applied, and that conducts electricity when the voltage correlated to the alternating-current voltage exceeds a threshold, and does not conduct electricity if the voltage correlated to the alternating-current voltage does not exceed the threshold, and the second edge circuit has a first voltage dividing unit that generates a voltage that is correlated to the alternating-current voltage by dividing the alternating-current voltage;

a delay circuit that delays a phase of the alternating-current voltage;

an addition circuit that adds the voltage outputted from the first voltage dividing unit and the voltage outputted from the delay circuit; and a second switch element that has a control terminal to which the voltage outputted from the addition circuit is applied and that switches between a conductive state and a non-conductive state in accordance with the voltage applied to the control terminal; and a third switch element that has a control terminal to which is applied a direct-current voltage which is generated from the alternating-current voltage and for which the second switch element controls application and non-application of the direct-current voltage, and that is connected in parallel with the first switch element, and the first edge circuit generates the first edge that indicates the timing of the zero cross by the first switch element transitioning from a conductive state to a non-conductive state, and the second edge circuit generates the second edge that indicates the voltage level by the third switch element transitioning from a conductive state to a non-conductive state by the second switch element transitioning from a non-conductive state to a conductive state in accordance with the voltage level of the alternating-current voltage when the first switch element is in a state in which the first switch element can conduct electricity.

13. The detection apparatus according to claim 3, wherein the first edge circuit has a first switch element that conducts electricity when the alternating-current voltage exceeds a threshold and does not conduct electricity if the alternating-current voltage does not exceed the threshold, and the second edge circuit has a first voltage dividing unit that generates a voltage that is correlated to the alternating-current voltage by dividing the alternating-current voltage;

a delay circuit that delays a phase of the alternating-current voltage;

an addition circuit that adds the voltage outputted from the first voltage dividing unit and the voltage outputted from the delay circuit;

a second switch element that has a control terminal to which the voltage outputted from the addition circuit is applied and that switches between a conductive state and a non-conductive state in accordance with the voltage applied to the control terminal; and a third switch element that has a control terminal to which is applied a direct-current voltage which is generated from the alternating-current voltage and for which the second switch element controls application and non-application of the direct-current voltage, and that is connected in parallel with the first switch element, the first edge circuit generates the first edge that indicates the timing of the zero cross by the first switch element transitioning from a conductive state to a non-conductive state, and the second edge circuit generates the second edge that indicates the voltage level by the third switch element transitioning from a conductive state to a non-conductive state by the second switch element transitioning from a non-conductive state to a conductive state in accordance with the voltage level of the alternating-current voltage when the first switch element is conducting electricity.

14. The detection apparatus according to claim 2, wherein the pulse generation circuit has a switch element, and a comparator that has hysteresis characteristics, and switches between a conductive state and a non-conductive state of the switch element in accordance with a voltage that is correlated to the alternating-current voltage, and the comparator causes the switch element to transition from a non-conductive state to a conductive state so that the switch element generates the first edge at the timing of the zero cross, and causes the switch element to transition from a conductive state to a non-conductive state so that the second edge is generated at a timing according to a gradient of the voltage that is correlated to the alternating-current voltage.

15. The detection apparatus according to claim 1, wherein the voltage value in a first case where the time period from the first timing of the pulse signal to the next second timing of the pulse signal is a first value, and the voltage value in a second case where the time period from the first timing of the pulse signal to the next second timing of the pulse signal is a second value smaller than the first value.

* * * * *